(12) United States Patent
Or-Bach et al.

(10) Patent No.: US 9,953,870 B2
(45) Date of Patent: *Apr. 24, 2018

(54) 3D SEMICONDUCTOR DEVICE AND SYSTEM

(71) Applicant: Monolithic 3D Inc., San Jose, CA (US)

(72) Inventors: Zvi Or-Bach, San Jose, CA (US);
Deepak C. Sekar, San Jose, CA (US);
Brian Cronquist, San Jose, CA (US);
Zeev Wurman, Palo Alto, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/488,514

(22) Filed: Apr. 16, 2017

(65) Prior Publication Data

US 2017/0221761 A1    Aug. 3, 2017

Related U.S. Application Data

(63) Continuation-in-part of application No. 14/975,830, filed on Dec. 20, 2015, now abandoned, which is a
(Continued)

(51) Int. Cl.
*H01L 21/77*    (2017.01)
*H01L 29/66*    (2006.01)
(Continued)

(52) U.S. Cl.
CPC .............. *H01L 21/77* (2013.01); *B82Y 10/00* (2013.01); *H01L 21/6835* (2013.01); *H01L 21/76254* (2013.01); *H01L 21/84* (2013.01); *H01L 23/3114* (2013.01); *H01L 23/4012* (2013.01); *H01L 23/5286* (2013.01); *H01L 24/01* (2013.01); *H01L 27/0207* (2013.01); *H01L 27/0688* (2013.01); *H01L 27/0694* (2013.01);
(Continued)

(58) Field of Classification Search
CPC ............. H01L 23/4012; H01L 27/0688; H01L 27/11551; H01L 27/11578; H01L 27/10; H01L 23/5286; H01L 27/0207; H01L 27/10897; H01L 29/66257; H01L 21/77; H01L 27/1052; H01L 27/10802; H01L 27/10894; H01L 27/1104; H01L 27/1116; H01L 27/11524; H01L 27/11526; H01L 27/11529; H01L 27/1157; H01L 27/11573; H01L 27/11807; H01L 27/1203; H01L 29/1033; H01L 29/6659; H01L 29/66825; H01L 29/66833; H01L 29/7841; H01L 29/785; H01L 29/78696; B82Y 10/00
See application file for complete search history.

(56) References Cited

U.S. PATENT DOCUMENTS

2009/0080265 A1 *  3/2009  Mokhlesi ................. G11C 7/12
365/185.23

* cited by examiner

*Primary Examiner* — Walter H Swanson
(74) *Attorney, Agent, or Firm* — Tran & Associates

(57) ABSTRACT

A 3D integrated circuit device, including: a first transistor; a second transistor; and a third transistor, where the third transistor is overlaying the second transistor and the third transistor is controlled by a third control line, where the second transistor is overlaying the first transistor and the second transistor is controlled by a second control line, where the first transistor is part of a control circuit controlling the second control line and the third control line, and where the second transistor and the third transistor are self-aligned.

20 Claims, 33 Drawing Sheets

Related U.S. Application Data continuation-in-part of application No. 13/623,756, filed on Sep. 20, 2012, now Pat. No. 9,219,005, which is a continuation of application No. 13/635,436, filed as application No. PCT/US2011/042071 on Jun. 28, 2011, now Pat. No. 8,642,416.

(51) Int. Cl.

| | |
|---|---|
| *H01L 27/10* | (2006.01) |
| *H01L 23/40* | (2006.01) |
| *H01L 23/00* | (2006.01) |
| *H01L 23/31* | (2006.01) |
| *H01L 27/02* | (2006.01) |
| *B82Y 10/00* | (2011.01) |
| *H01L 21/84* | (2006.01) |
| *H01L 23/528* | (2006.01) |
| *H01L 21/683* | (2006.01) |
| *H01L 21/762* | (2006.01) |
| *H01L 27/06* | (2006.01) |
| *H01L 29/78* | (2006.01) |
| *H01L 27/092* | (2006.01) |
| *H01L 27/105* | (2006.01) |
| *H01L 27/108* | (2006.01) |
| *H01L 29/786* | (2006.01) |
| *H01L 29/788* | (2006.01) |
| *H01L 29/792* | (2006.01) |
| *H01L 27/11* | (2006.01) |
| *H01L 27/11524* | (2017.01) |
| *H01L 27/11526* | (2017.01) |
| *H01L 27/11529* | (2017.01) |
| *H01L 27/11551* | (2017.01) |
| *H01L 27/1157* | (2017.01) |
| *H01L 27/11573* | (2017.01) |
| *H01L 27/11578* | (2017.01) |
| *H01L 27/118* | (2006.01) |
| *H01L 27/12* | (2006.01) |
| *H01L 29/10* | (2006.01) |
| *G11C 16/04* | (2006.01) |
| *H01L 23/36* | (2006.01) |
| *H01L 23/367* | (2006.01) |
| *H01L 27/088* | (2006.01) |

(52) U.S. Cl.

CPC ............ *H01L 27/092* (2013.01); *H01L 27/10* (2013.01); *H01L 27/1052* (2013.01); *H01L 27/10802* (2013.01); *H01L 27/10894* (2013.01); *H01L 27/10897* (2013.01); *H01L 27/1104* (2013.01); *H01L 27/1108* (2013.01); *H01L 27/1116* (2013.01); *H01L 27/1157* (2013.01); *H01L 27/11524* (2013.01); *H01L 27/11526* (2013.01); *H01L 27/11529* (2013.01); *H01L 27/11551* (2013.01); *H01L 27/11573* (2013.01); *H01L 27/11578* (2013.01); *H01L 27/11807* (2013.01); *H01L 27/1203* (2013.01); *H01L 29/1033* (2013.01); *H01L 29/6659* (2013.01); *H01L 29/66257* (2013.01); *H01L 29/66825* (2013.01); *H01L 29/66833* (2013.01); *H01L 29/785* (2013.01); *H01L 29/7841* (2013.01); *H01L 29/7881* (2013.01); *H01L 29/78696* (2013.01); *H01L 29/792* (2013.01); *G11C 16/0408* (2013.01); *G11C 16/0483* (2013.01); *H01L 23/36* (2013.01); *H01L 23/3677* (2013.01); *H01L 24/13* (2013.01); *H01L 24/16* (2013.01); *H01L 24/32* (2013.01); *H01L 24/48* (2013.01); *H01L 27/088* (2013.01); *H01L 29/66795* (2013.01); *H01L 2221/6835* (2013.01); *H01L 2221/68381* (2013.01); *H01L 2224/131* (2013.01); *H01L 2224/16145* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2224/81001* (2013.01); *H01L 2924/00014* (2013.01); *H01L 2924/10253* (2013.01); *H01L 2924/12032* (2013.01); *H01L 2924/12042* (2013.01); *H01L 2924/1305* (2013.01); *H01L 2924/13062* (2013.01); *H01L 2924/13091* (2013.01); *H01L 2924/1461* (2013.01); *H01L 2924/15311* (2013.01); *H01L 2924/3011* (2013.01); *H01L 2924/3025* (2013.01)

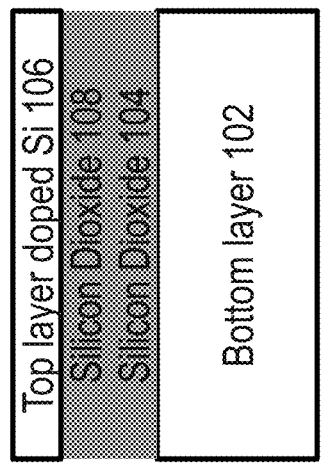

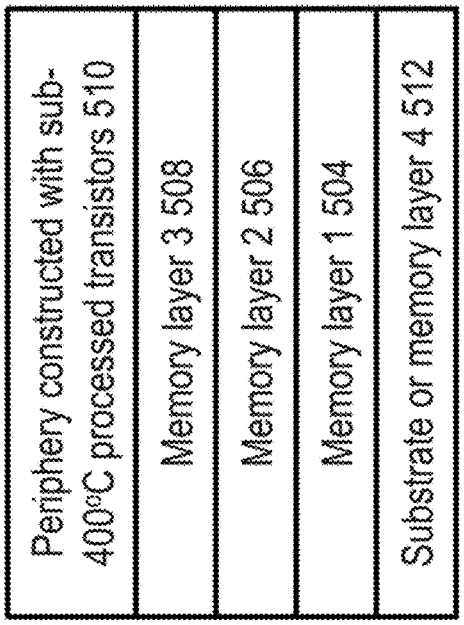
Fig. 5B: Periphery-on-top architecture
An alternative
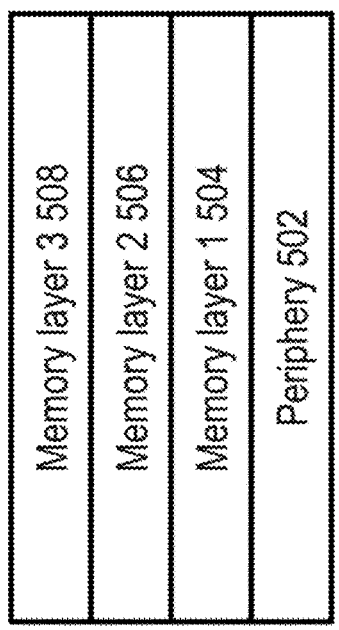
Fig. 5A: Periphery-on-bottom architecture
Used for Fig. 1-4

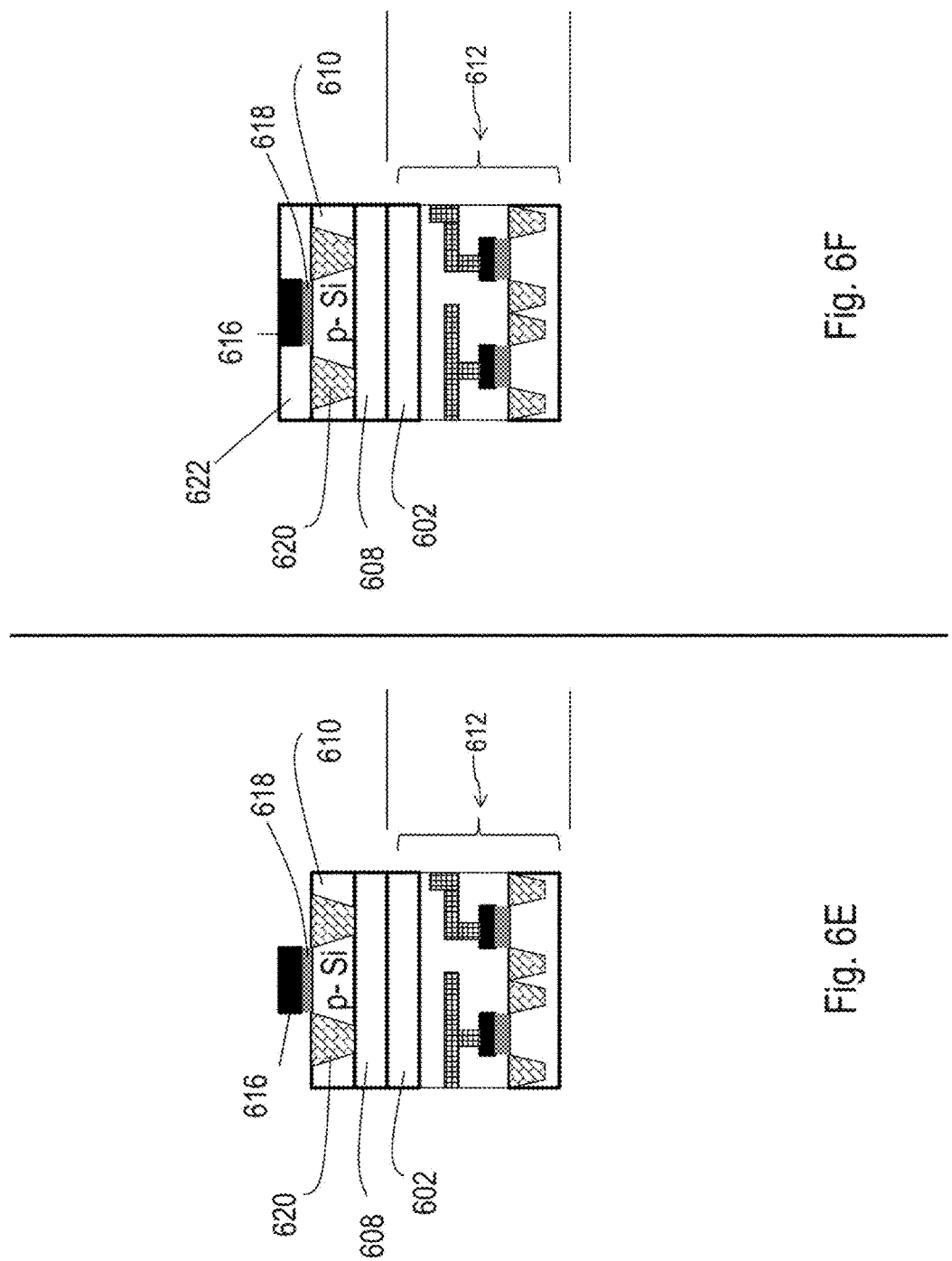

3D SEMICONDUCTOR DEVICE AND SYSTEM

This application is a continuation-in-part of co-pending U.S. patent application Ser. No. 14/975,830, filed on Dec. 20, 2015, which is a continuation-in-part of U.S. patent application Ser. No. 13/623,756, filed on Sep. 20, 2012, now U.S. Pat. No. 9,219,005 issued on Dec. 22, 2015, which is a continuation of U.S. patent application Ser. No. 13/635,436, filed on Sep. 16, 2012, now U.S. Pat. No. 8,642,416 issued on Feb. 4, 2014, which is a national stage application into the USPTO of PCT/US2011/042071 of international filing date Jun. 28, 2011. The contents of the foregoing applications are incorporated herein by reference.

BACKGROUND OF THE INVENTION

1. Field of the Invention

The invention relates to the general field of Integrated Circuit (IC) devices and fabrication methods, and more particularly to multilayer or Three Dimensional Integrated Circuit (3D-IC) devices 2. Discussion of Background Art Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today may be that wires dominate performance, functionality and power consumption of ICs.

3D stacking of semiconductor chips may be one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer may be constructed using Temperatures higher than 700° C., it can damage the Bottom Wiring Layer.

Due to the above mentioned problem with forming transistor layers above wiring layers at temperatures lower than 400° C., the semiconductor industry has largely explored alternative architectures for 3D stacking. In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer may be large and the number of these Contacts may be small. In fact, prototypes of 3D stacked chips today utilize as few as 10,000 connections between two layers, compared to billions of connections within a layer. This low connectivity between layers may be because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs may be not easy. This places a restriction on lateral dimensions of TSVs, which in turn impacts TSV density and contact density to another stacked layer. Therefore, connectivity between two wafers may be limited.

It may be highly desirable to circumvent these issues and build 3D stacked semiconductor chips with a high-density of connections between layers. To achieve this goal, it may be sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

U.S. Pat. No. 7,052,941 from Sang-Yun Lee ("S-Y Lee") describes methods to construct vertical transistors above wiring layers at less than 400° C. In these single crystal Si transistors, current flow in the transistor's channel region may be in the vertical direction. Unfortunately, however, almost all semiconductor devices in the market today (logic, DRAM, flash memory) utilize horizontal (or planar) transistors due to their many advantages, and it may be difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," *IEDM Tech. Digest*, p. 363 (2005) by A. W. Topol, D. C. La Tulipe, L. Shi, et al. ("Topol"). A process flow may be utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors may be produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (φFlash), Suitable for Full 3D Integration", International Electron Devices Meeting, 2009 by A. Hubert, et al ("Hubert"). However, the approach described by Hubert has some challenges including the use of difficult-to-manufacture nanowire transistors, higher defect densities due to formation of Si and SiGe layers atop each other, high temperature processing for long times, and difficult manufacturing.

It is clear based on the background art mentioned above that invention of novel technologies for 3D stacked chips will be useful.

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today may be that wires dominate performance, functionality and power consumption of ICs.

3D stacking of semiconductor devices or chips may be one avenue to tackle the issues with wires. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,450,804, 8,476,145, 8,536,023, 8,574,929, 8,581,349, 8,642,416, 8,687,399, 8,742,476, 8,674,470, 8,803,206, 8,836,073, 8,902,663, 8,994,404, 9,021,414, 9,023,688, 9,030,858, 9,117,749, 9,142,553, 9,219,005, 9,385,088, 9,406,670, 9,460,978, 9,509,313; U.S. patent application publications 2011/0092030, 2016/0218046; and pending U.S. patent applications Ser. Nos. 14/607,077, 14/642,724, 62/307,568, 62/297,857, 15/095,187, 15/150,395, 15/173,686, 62/383, 463, 62/440,720, 62/443,751, 15/243,941, PCT/US16/52726, 62/406,376, 62/432,575, 62/440,720, 62/297,857, 15/333,138, 15/344,562, and 15/351,389. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753, 913, 8,823,122, 9,197,804, 9,419,031; and U.S. patent application publication 2016/0064439. The entire contents of the foregoing patents, publications, and applications are incorporated herein by reference.

Irrespective of the technique used to construct 3D stacked integrated circuits or chips, heat removal may be a serious issue for this technology. For example, when a layer of circuits with power density P may be stacked atop another layer with power density P, the net power density may be 2P. Removing the heat produced due to this power density may be a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Many publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

SUMMARY

In one aspect, a 3D integrated circuit device, comprising: a first transistor; a second transistor; and a third transistor, wherein said third transistor is overlaying said second transistor and said third transistor is controlled by a third control line, wherein said second transistor is overlaying said first transistor and said second transistor is controlled by a second control line, wherein said first transistor is part of a control circuit controlling said second control line and said third control line, wherein said second transistor and said third transistor are self-aligned.

In another aspect, a 3D integrated circuit device, comprising: a first transistor; a second transistor; and a third transistor, wherein said third transistor is overlaying said second transistor and said third transistor is controlled by a third control line, wherein said second transistor is overlaying said first transistor and said second transistor is controlled by a second control line, wherein said second transistor comprises a schottky barrier, and wherein said second transistor and said third transistor are self-aligned.

In another aspect, a 3D integrated circuit device, comprising: a first transistor; a first memory cell comprising a second transistor; and a second memory cell comprising a third transistor, wherein said third transistor is overlaying said second transistor and said second transistor is overlaying said first transistor, wherein said first transistor is part of a control circuit controlling said first memory cell and second memory cell, wherein said second transistor is self-aligned to said third transistor, and wherein said second transistor is connected to said third transistor with an ohmic connection.

BRIEF DESCRIPTION OF THE DRAWINGS

Various embodiments of the invention will be understood and appreciated more fully from the following detailed description, taken in conjunction with the drawings in which:

FIGS. 1A-1E depicts a layer transfer flow using ion-cut in which a top layer of doped Si may be layer transferred atop a generic bottom layer;

FIGS. 2A-2K show a zero-mask per layer 3D floating body DRAM;

FIGS. 5A-5B show periphery below and on top of memory layers; and

FIGS. 6A-6F illustrates a technique to construct sub-400° C. 3D stacked transistors by reducing temperatures needed for Source and drain anneals.

DETAILED DESCRIPTION

Figure 1A:

Embodiments of the invention are now described with reference to the figures, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

Embodiments of the invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the spirit of the appended claims.

This section of the document describes a technology to construct single-crystal silicon transistors atop wiring layers with less than 400° C. processing temperatures. This allows construction of 3D stacked semiconductor chips with high density of connections between different layers, because the top-level transistors are formed well-aligned to bottom-level wiring and transistor layers. Since the top-level transistor layers are very thin (preferably less than about 200 nm), alignment can be done through these thin silicon and oxide layers to features in the bottom-level.

FIGS. 1A-1E illustrates an ion-cut flow for layer transferring a single crystal silicon layer atop any generic bottom layer 102. The bottom layer 102 can be a single crystal silicon layer. Alternatively, it can be a wafer having transistors with wiring layers above it. This process of ion-cut based layer transfer may include several steps, as described in the following sequence:

Step (A): A silicon dioxide layer 104 may be deposited above the generic bottom layer 102. FIG. 1A illustrates the structure after Step (A) is completed.

Figure 1B:
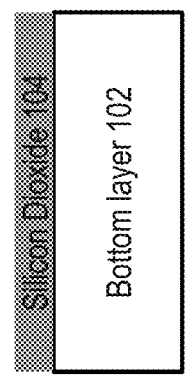

Step (B): The top layer of doped or undoped silicon 106 to be transferred atop the bottom layer may be processed and an oxide layer 108 may be deposited or grown above it. FIG. 1B illustrates the structure after Step (B) is completed.

Figure 1C:
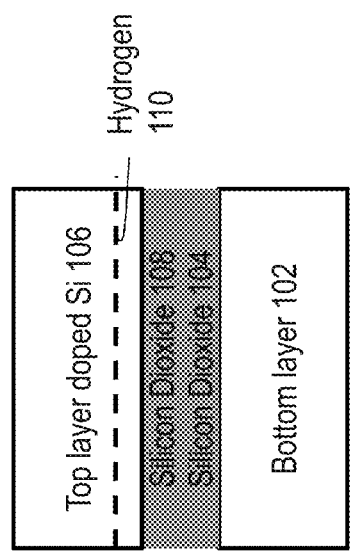

Step (C): Hydrogen may be implanted into the top layer silicon 106 with the peak at a certain depth to create the hydrogen plane 110. Alternatively, another atomic species such as helium or boron can be implanted or co-implanted. FIG. 1C illustrates the structure after Step (C) is completed.

Figure 1D:
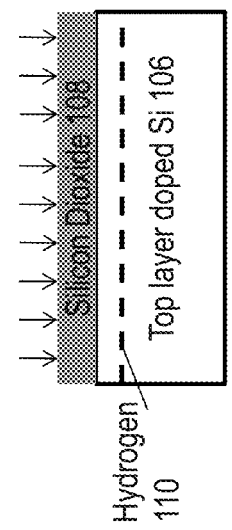

Step (D): The top layer wafer shown after Step (C) may be flipped and bonded atop the bottom layer wafer using oxide-to-oxide bonding. FIG. 1D illustrates the structure after Step (D) is completed.

Step (E): A cleave operation may be performed at the hydrogen plane 110 using an anneal. Alternatively, a sideways mechanical force may be used. Further details of this cleave process are described in "Frontiers of silicon-on-insulator," J. Appl. Phys. 93, 4955-4978 (1003) by G. K. Celler and S. Cristoloveanu ("Celler") and "Mechanically induced Si layer transfer in hydrogen-implanted Si wafers," Appl. Phys. Lett., vol. 76, pp. 1370-1372, 1000 by K. Henttinen, I. Suni, and S. S. Lau ("Hentinnen"). Following this, a Chemical-Mechanical-Polish (CMP) may be done. FIG. 1E illustrates the structure after Step (E) is completed.

One method to solve the issue of high-temperature source-drain junction processing may be to make transistors without junctions i.e. Junction-Less Transistors (JLTs). An embodiment of this invention uses JLTs as a building block for 3D stacked semiconductor circuits and chips.

Further details of the JLT can be found in "Junctionless multigate field-effect transistor," Appl. Phys. Lett., vol. 94, pp. 053511 2009 by C.-W. Lee, A. Afzalian, N. Dehdashti Akhavan, R. Yan, I. Ferain and J. P. Colinge ("C-W. Lee"). Contents of this publication are incorporated herein by reference.

Many of the types of embodiments of this invention described herein utilize single crystal silicon or monocrystalline silicon transistors. These terms may be used interchangeably. Thicknesses of layer transferred regions of silicon are <2 um, and many times can be <1 um or <0.4 um or even <0.2 um. Interconnect (wiring) layers are preferably constructed substantially of copper or aluminum or some other high conductivity material.

While ion-cut has been described in previous sections as the method for layer transfer, several other procedures exist that fulfill the same objective. These include:
  Lift-off or laser lift-off: Background information for this technology is given in "Epitaxial lift-off and its applications", 1993 Semicond. Sci. Technol. 8 1124 by P Demeester et al. ("Demeester").
  Porous-Si approaches such as ELTRAN: Background information for this technology is given in "Eltran, Novel SOI Wafer Technology", JSAP International, Number 4, July 2001 by T. Yonehara and K. Sakaguchi ("Yonehara") and also in "Frontiers of silicon-on-insulator," J. Appl. Phys. 93, 4955-4978, 2003 by G. K. Celler and S. Cristoloveanu ("Celler").
  Time-controlled etch-back to thin an initial substrate, Polishing, Etch-stop layer controlled etch-back to thin an initial substrate: Background information on these technologies is given in Celler and in U.S. Pat. No. 6,806,171.
  Rubber-stamp based layer transfer: Background information on this technology is given in "Solar cells sliced and diced", 19 May 2010, Nature News.

The above publications giving background information on various layer transfer procedures are incorporated herein by reference. It is obvious to one skilled in the art that one can form 3D integrated circuits and chips as described in this document with layer transfer schemes described in these publications.

This Section describes novel monolithic 3D Dynamic Random Access Memories (DRAMs). Some embodiments of this invention may involve floating body DRAM. Background information on floating body DRAM and its operation is given in "Floating Body RAM Technology and its Scalability to 32 nm Node and Beyond," *Electron Devices Meeting,* 2006. *IEDM '06. International,* vol., no., pp.1-4, 11-13 Dec. 2006 by T. Shino, N. Kusunoki, T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC'08, July 2009, Pages 676-683, ISSN 0038-1101, DOI: 10.1016/j.sse.2009.03.010 by Takeshi Hamamoto, Takashi Ohsawa, et al., "New Generation of Z-RAM," *Electron Devices Meeting,* 2007. *IEDM 2007. IEEE International,* vol., no., pp.925-928, 10-12 Dec. 2007 by Okhonin, S.; Nagoga, M.; Carman, E, et al. The above publications are incorporated herein by reference.

FIG. 2A-K describe an alternative process flow to construct a horizontally-oriented monolithic 3D DRAM. This monolithic 3D DRAM utilizes the floating body effect and double-gate transistors. No mask may be utilized on a "per-memory-layer" basis for the monolithic 3D DRAM concept shown in FIG. 2A-K, and all other masks are shared between different layers. The process flow may include several steps in the following sequence.

Figure 2A:
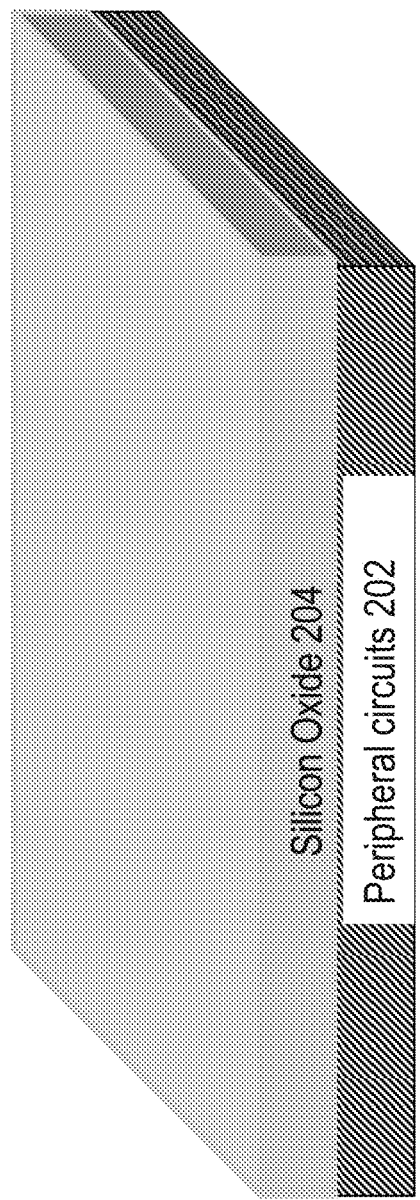

Step (A): Peripheral circuits with tungsten wiring 202 are first constructed and above this oxide layer 204 may be deposited. FIG. 2A shows a drawing illustration after Step (A).

Figure 2B:
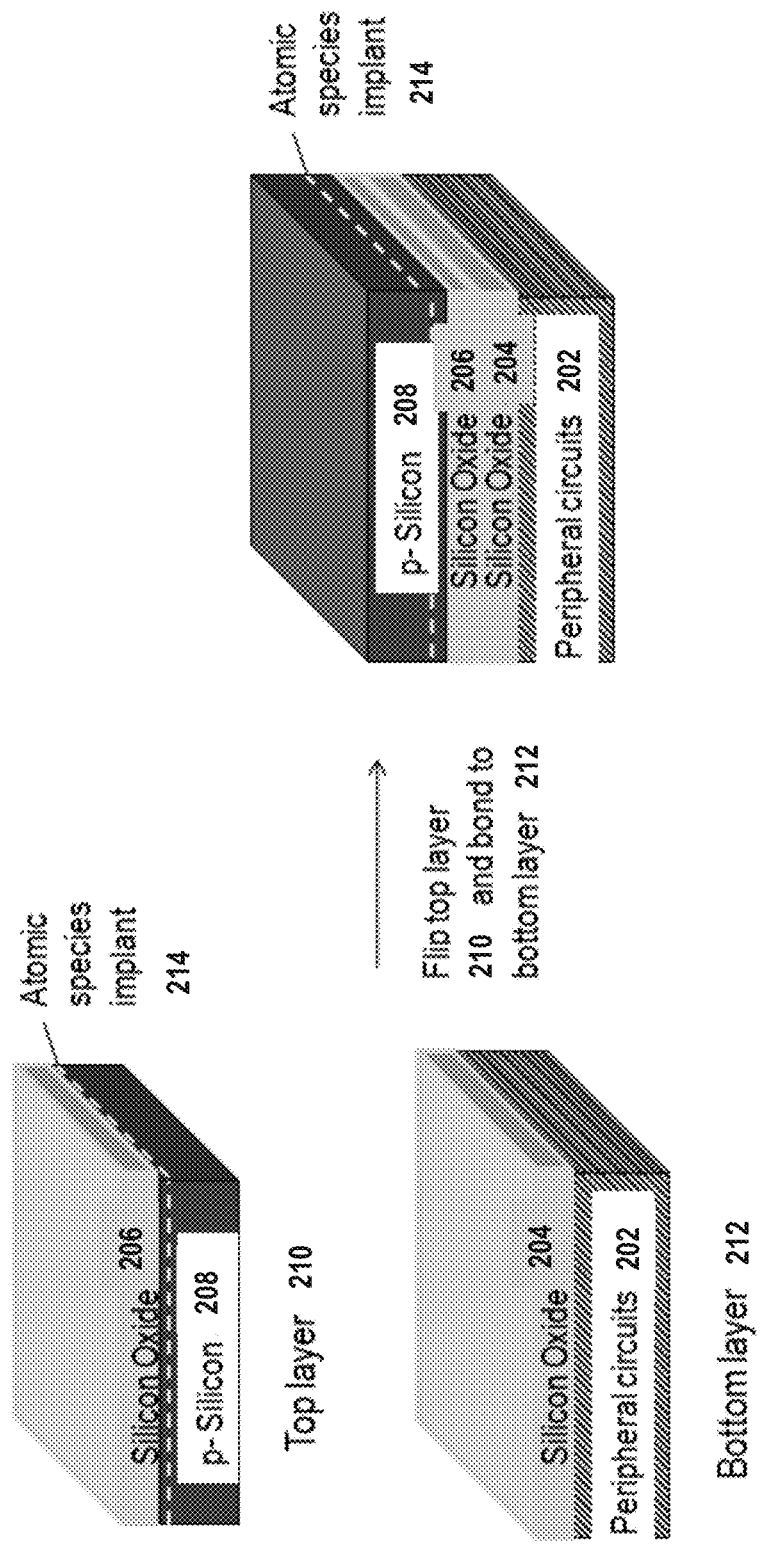

Step (B): FIG. 2B illustrates the structure after Step (B). A p− Silicon wafer 208 has an oxide layer 206 grown or deposited above it. A doped and activated layer may be formed in or on p− silicon wafer 208 by processes such as, for example, implant and RTA or furnace activation, or epitaxial deposition and activation. Following this, hydrogen may be implanted into the p− Silicon wafer at a certain depth indicated by 214. Alternatively, some other atomic species such as Helium could be (co-)implanted. This hydrogen implanted p− Silicon wafer 208 forms the top layer 210. The bottom layer 212 may include the peripheral circuits 202 with oxide layer 204. The top layer 210 may be flipped and bonded to the bottom layer 212 using oxide-to-oxide bonding.

Figure 2C:
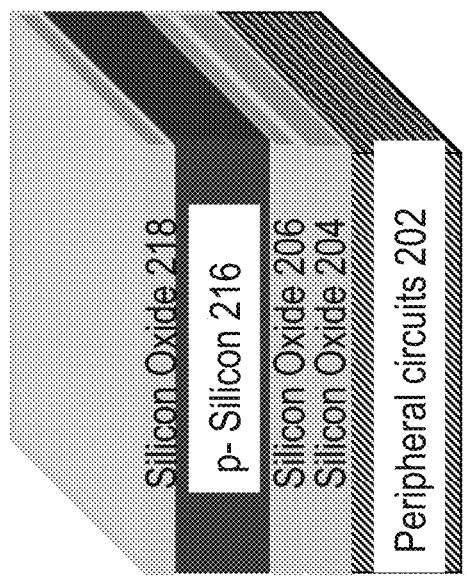

Step (C): FIG. 2C illustrates the structure after Step (C). The stack of top and bottom wafers after Step (B) may be cleaved at the hydrogen plane 214 using either a anneal or a sideways mechanical force or other means. A CMP process may be then conducted. A layer of silicon oxide 218 may be then deposited atop the p− Silicon layer 216. At the end of this step, a single-crystal p− Silicon layer 216 exists atop the peripheral circuits, and this has been achieved using layer transfer techniques.

Figure 2D:
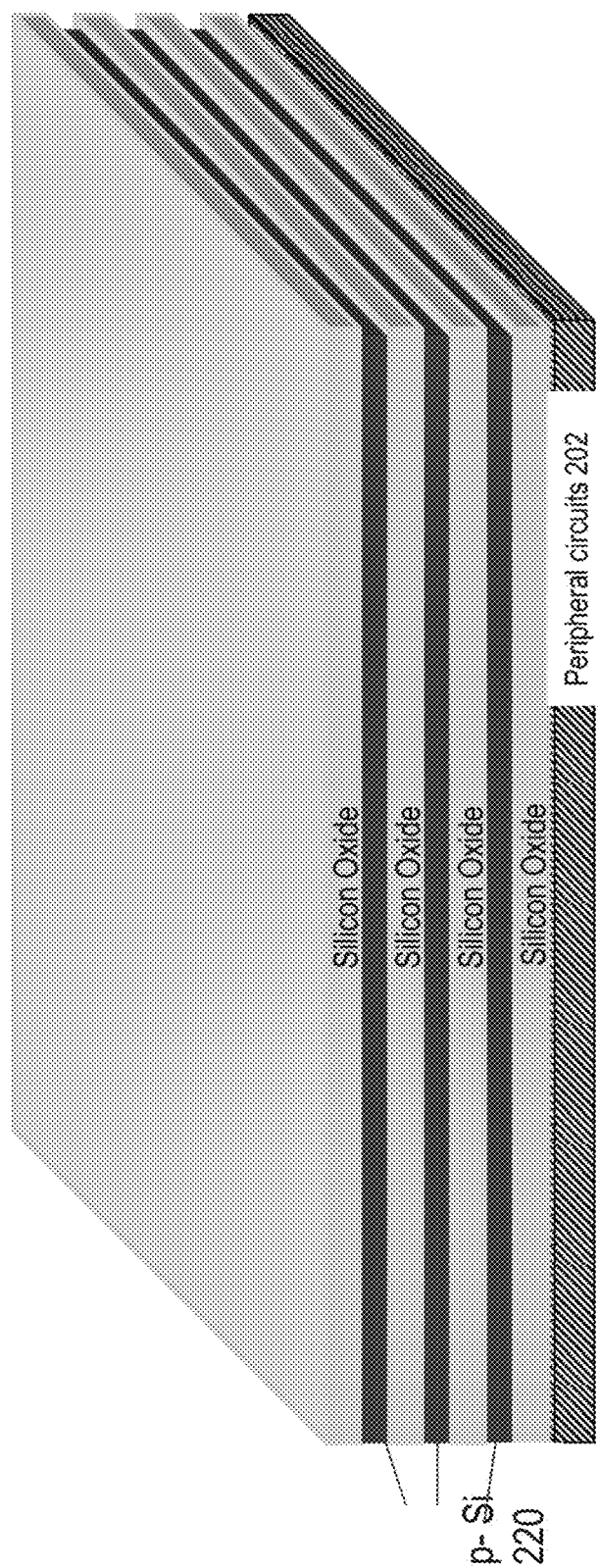

Step (D): FIG. 2D illustrates the structure after Step (D). Using methods similar to Step (B) and (C), multiple p-silicon layers 220 are formed with silicon oxide layers in between.

Figure 2E:
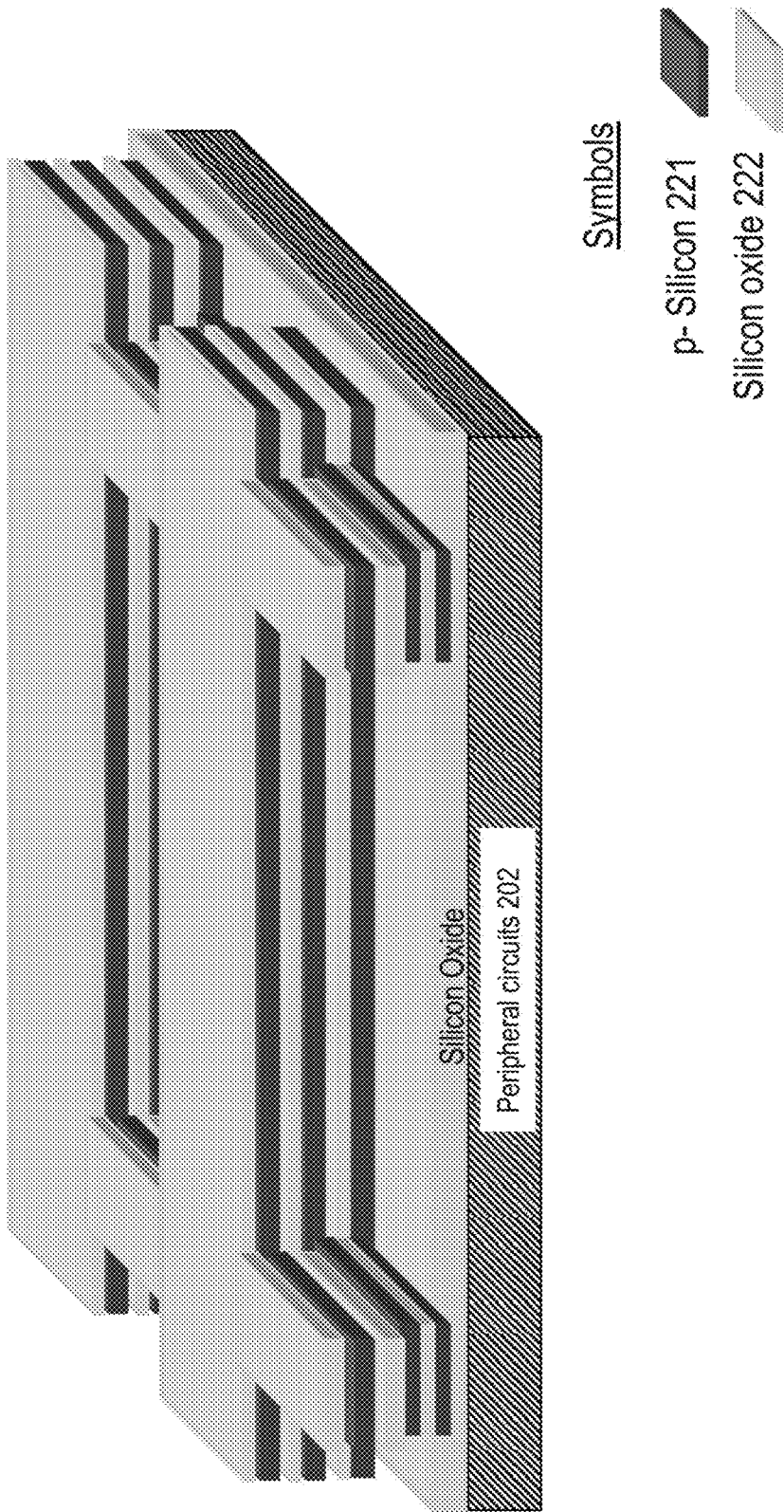

Step (E): FIG. 2E illustrates the structure after Step (E). Lithography and etch processes may then be utilized to make a structure as shown in the figure, including p− silicon layer regions 221 and silicon oxide layer regions 222.

Figure 2F:
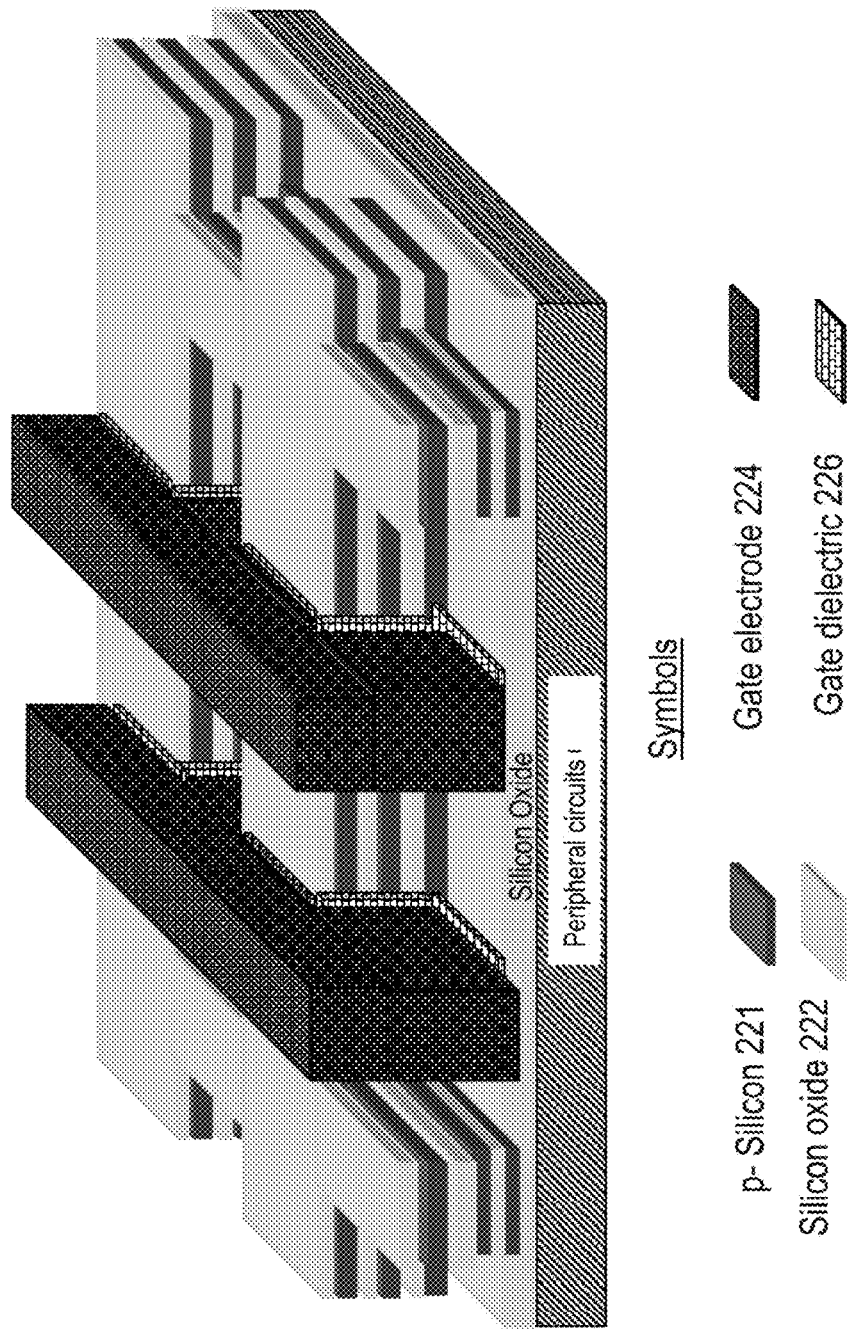

Step (F): FIG. 2F illustrates the structure after Step (F). Gate dielectric 226 and gate electrode 224 are then deposited following which a CMP may be done to planarize the gate electrode 224 regions. Lithography and etch are utilized to define gate regions.

Figure 2G:
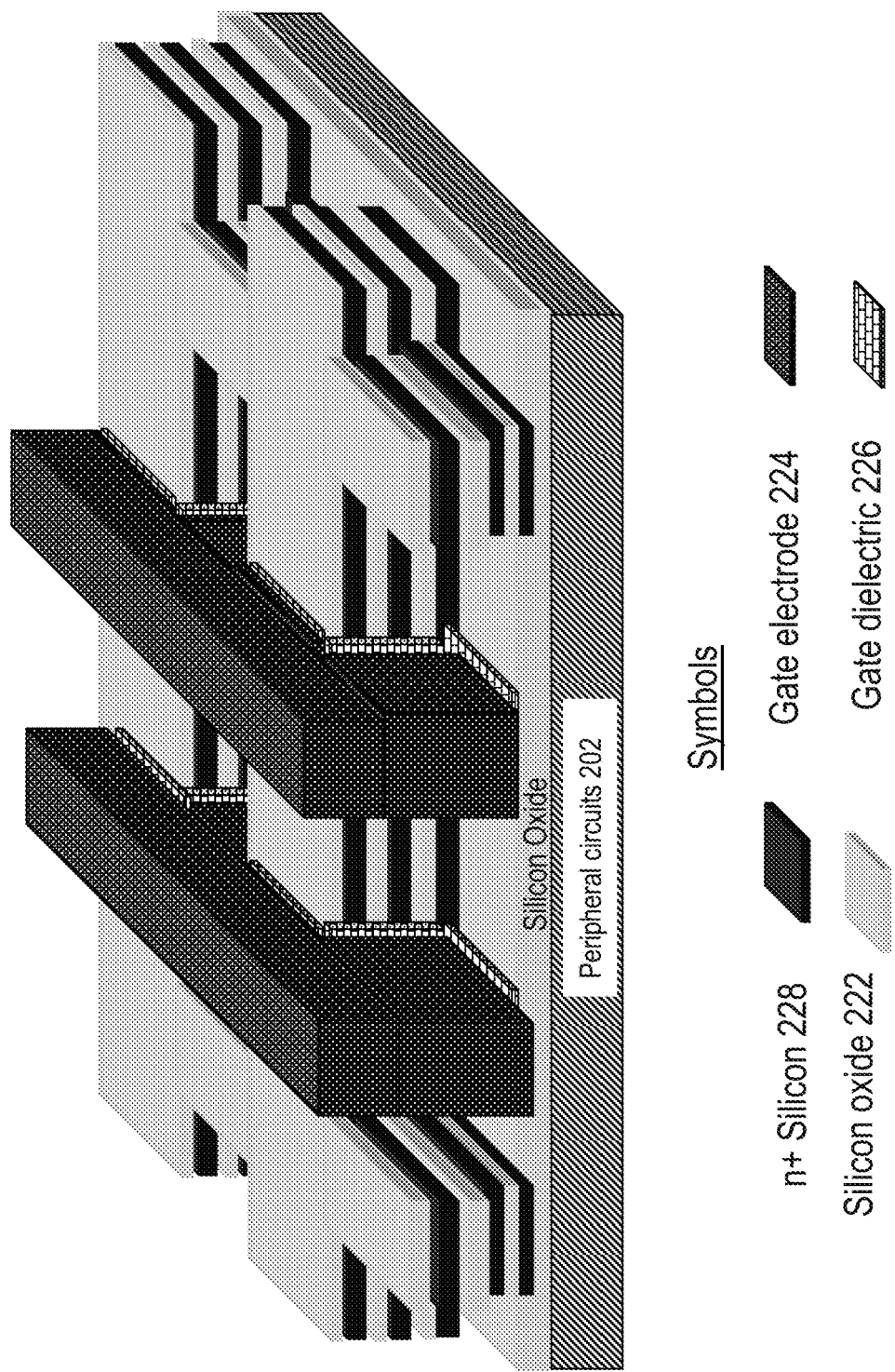

Step (G): FIG. 2G illustrates the structure after Step (G). Using the hard mask defined in Step (F), p− regions not covered by the gate are implanted to form n+ regions 228. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, may be then conducted to activate n+ doped regions.

Figure 2H:
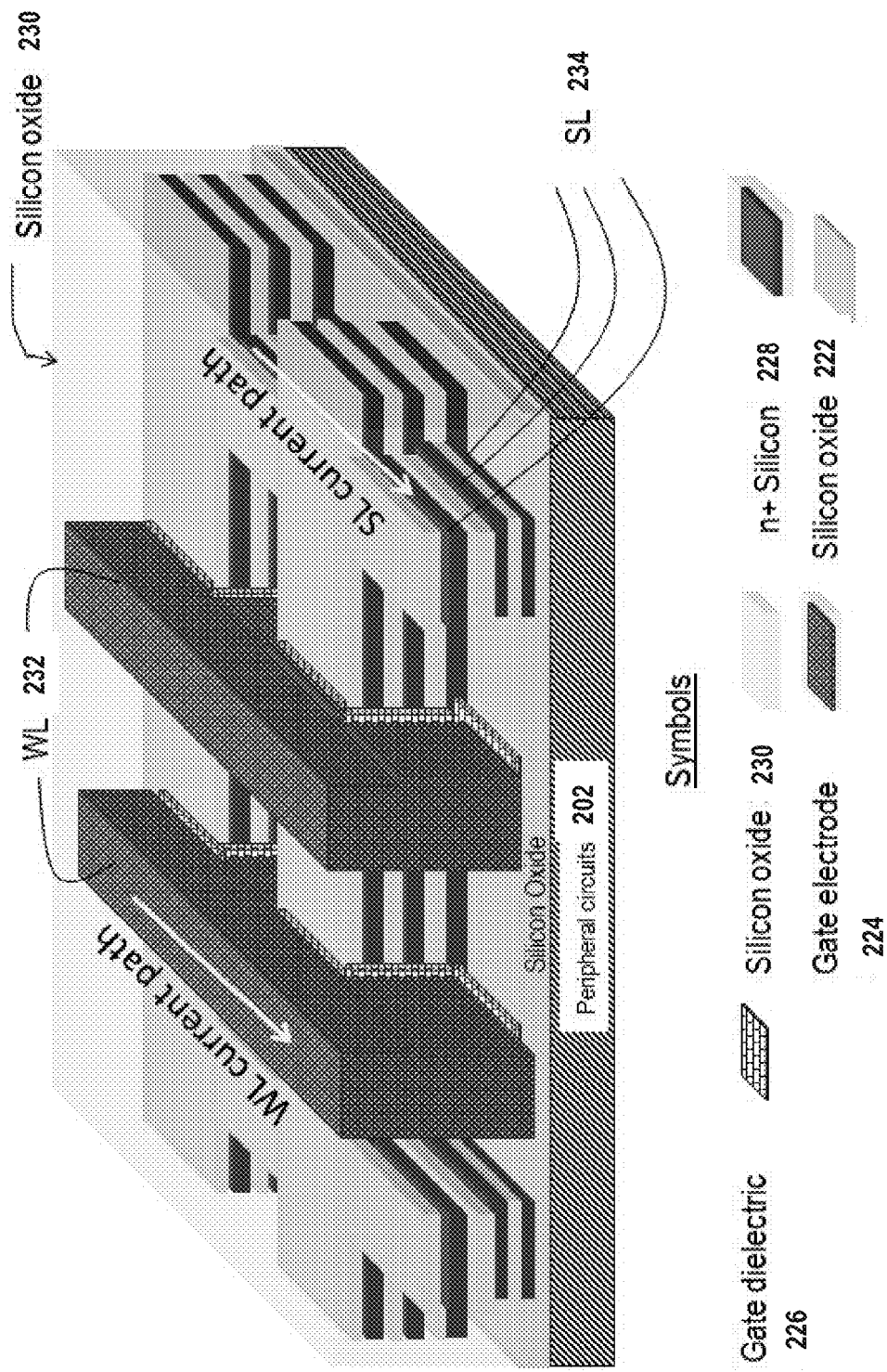
Figure 21:
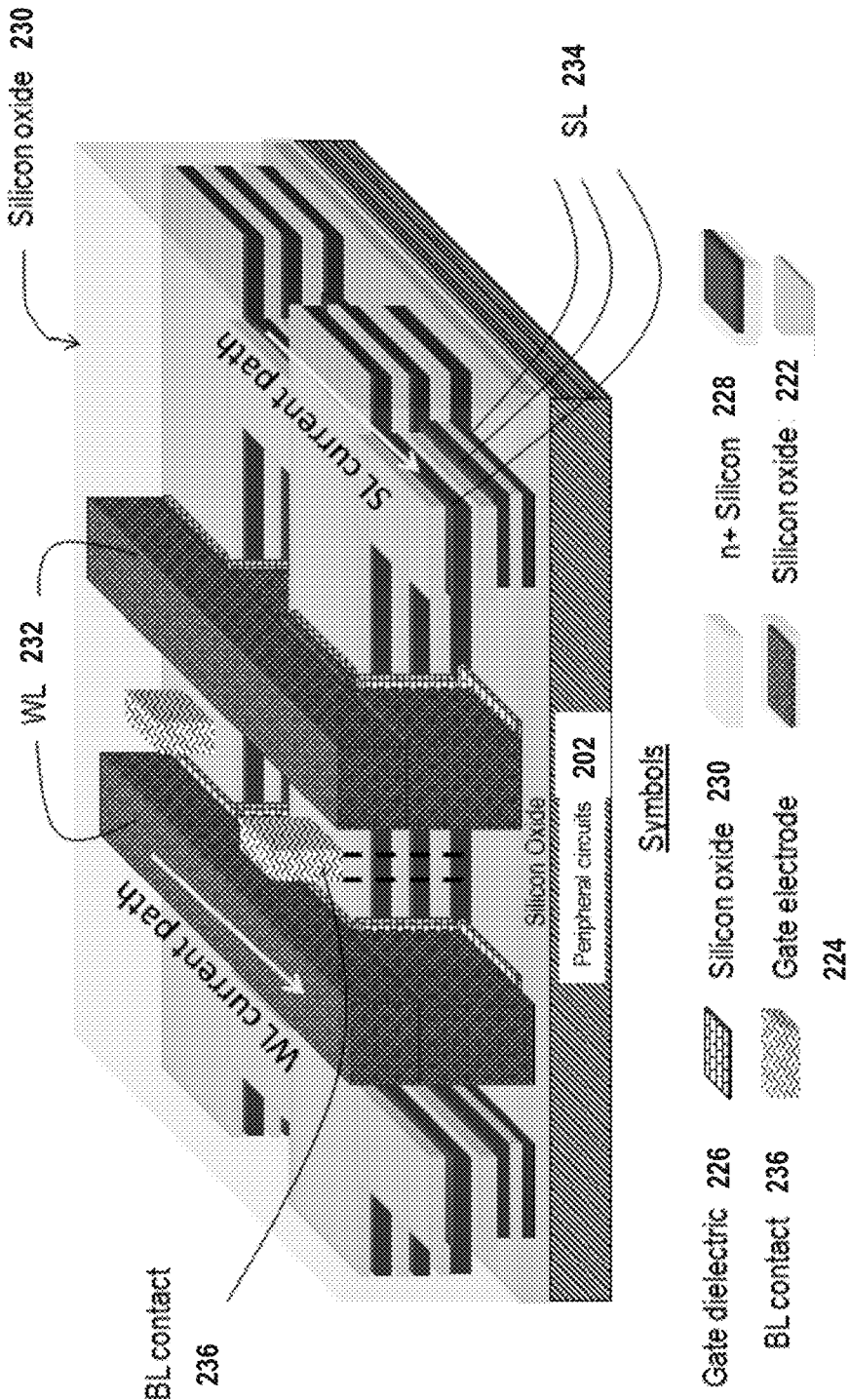

Step (H): FIG. 2H illustrates the structure after Step (H). A silicon oxide layer 230 may be then deposited and planarized. For clarity, the silicon oxide layer may be shown transparent, along withword-line (WL) 232 and sourceline (SL) 234 regions.

Step (I): FIG. 2I illustrates the structure after Step (I). Bit-line (BL) contacts 236 are formed by etching and deposition. These BL contacts are shared among all layers of memory.

Figure 2J:
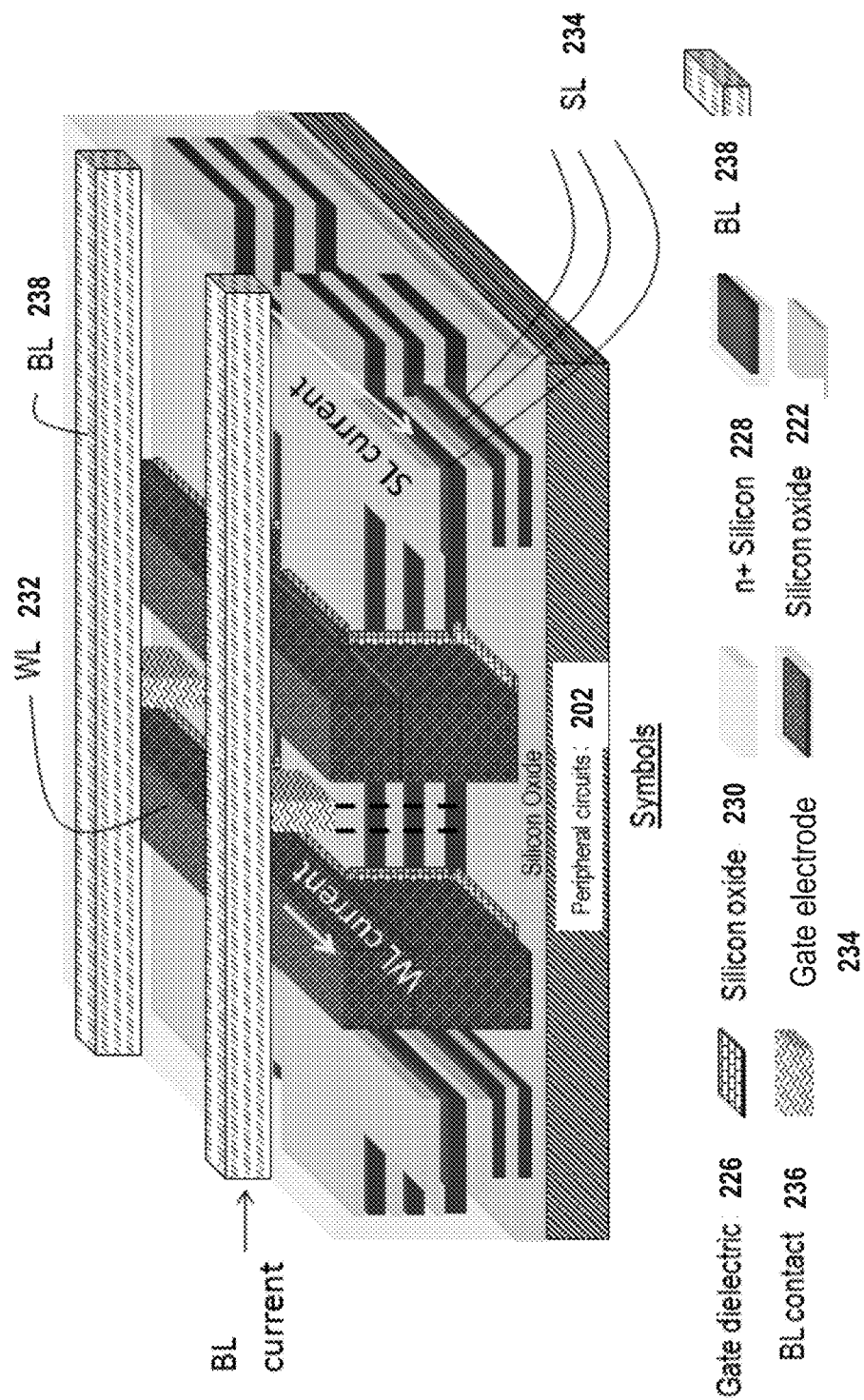

Step (J): FIG. 2J illustrates the structure after Step (J). BLs 238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on, vol., no., pp.* 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

Figure 2K:
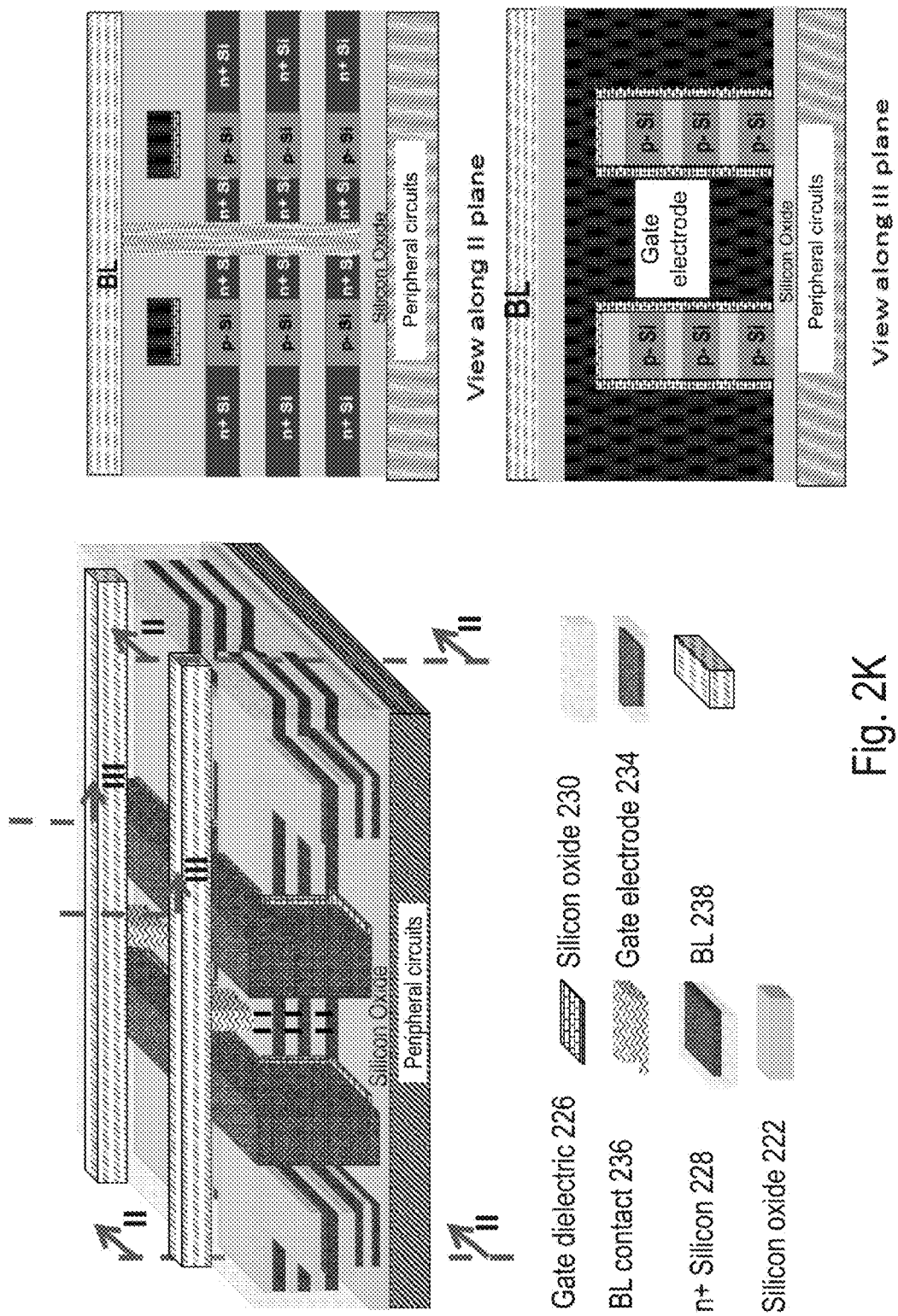

FIG. 2K shows cross-sectional views of the array for clarity. Double-gated transistors may be utilized along with the floating body effect for storing information.

A floating body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) mono-crystalline (or single crystal) silicon layers obtained by layer transfer techniques such as ion-cut.

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, conductive bridge RAM, and MRAM. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIGS. 3A-3J describe a novel memory architecture for resistance-based memories, and a procedure for its construction. The memory architecture utilizes junction-less transistors and has a resistance-based memory element in series with a transistor selector. No mask may be utilized on a "per-memory-layer" basis for the monolithic 3D resistance change memory (or resistive memory) concept shown in FIGS. 3A-3J, and all other masks are shared between different layers. The process flow may include several steps that occur in the following sequence.

Figure 3A:
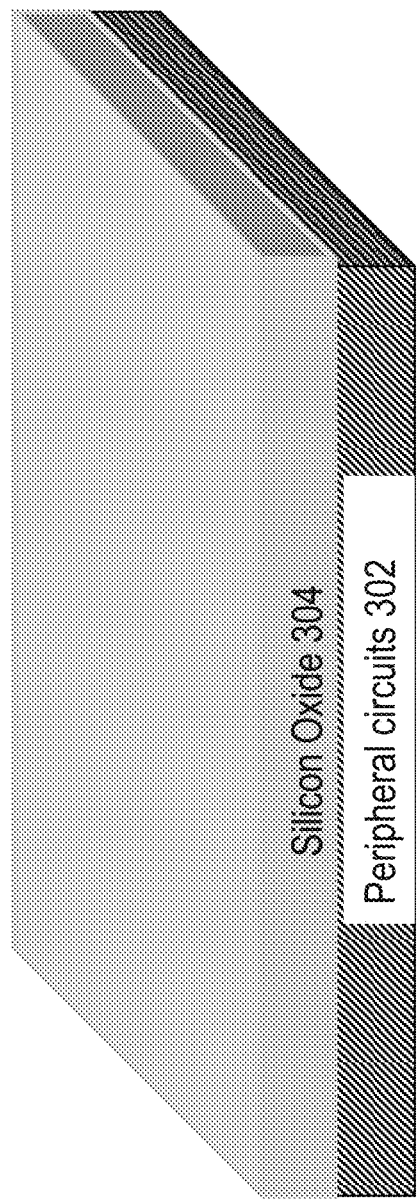
FIGS. 3A-3J show a zero-mask per layer 3D resistive memory with a junction-less transistor.

Step (A): Peripheral circuits 302 are first constructed and above this oxide layer 304 may be deposited. FIG. 3A shows a drawing illustration after Step (A).

Figure 3B:
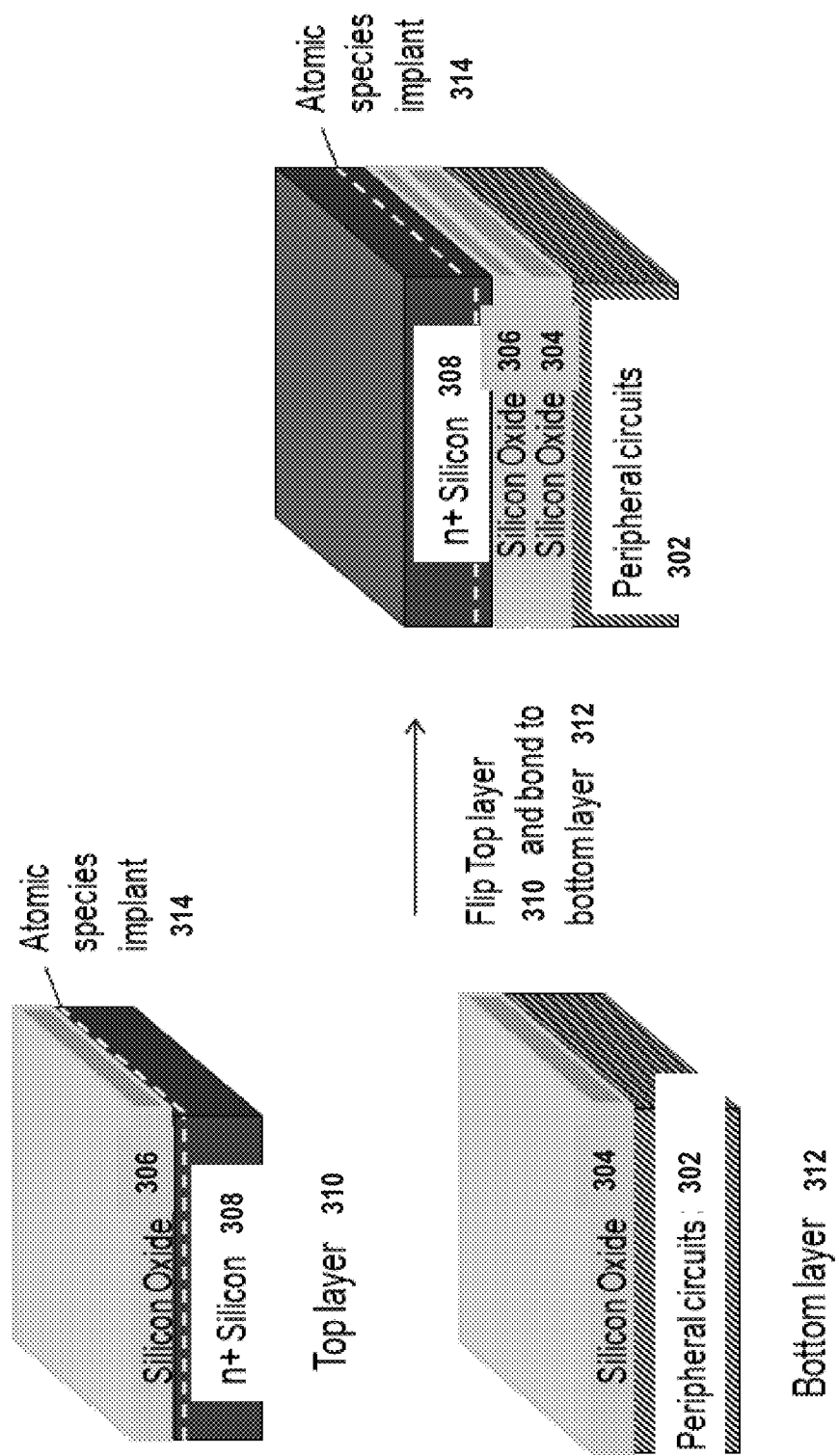

Step (B): FIG. 3B illustrates the structure after Step (B). N+ Silicon wafer 308 has an oxide layer 306 grown or deposited above it. A doped and activated layer may be formed in or on N+ silicon wafer 308 by processes such as, for example, implant and RTA or furnace activation, or epitaxial deposition and activation. Following this, hydrogen may be implanted into the n+ Silicon wafer at a certain depth indicated by 314. Alternatively, some other atomic species such as Helium could be (co-)implanted. This hydrogen implanted n+ Silicon wafer 308 forms the top layer 310. The bottom layer 312 may include the peripheral circuits 302 with oxide layer 304. The top layer 310 may be flipped and bonded to the bottom layer 312 using oxide-to-oxide bonding.

Figure 3C:
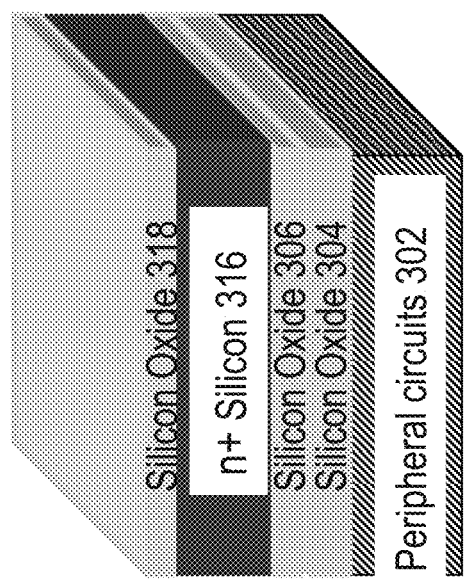

Step (C): FIG. 3C illustrates the structure after Step (C). The stack of top and bottom wafers after Step (B) may be cleaved at the hydrogen plane 314 using either a anneal or a sideways mechanical force or other means. A CMP process may be then conducted. A layer of silicon oxide 318 may be then deposited atop the n+ Silicon layer 316.

At the end of this step, a single-crystal n+ Si layer 316 exists atop the peripheral circuits, and this has been achieved using layer transfer techniques.

Figure 3D:
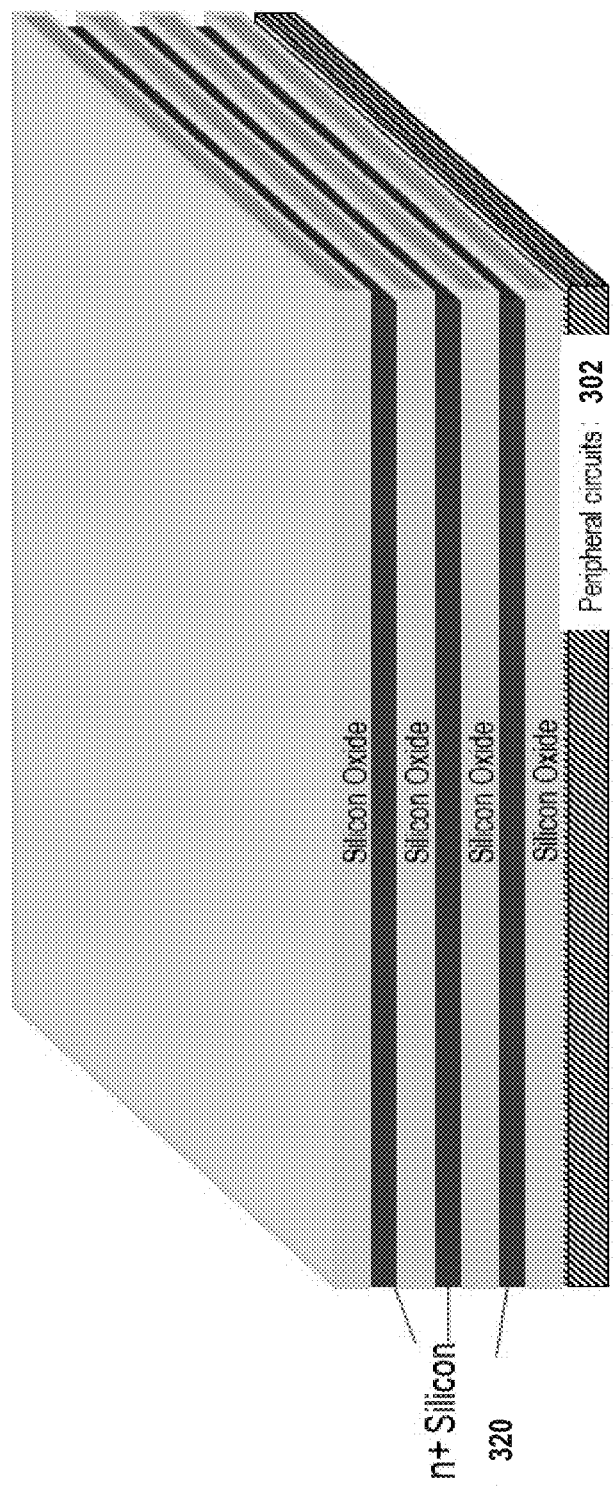

Step (D): FIG. 3D illustrates the structure after Step (D). Using methods similar to Step (B) and (C), multiple n+ silicon layers 320 are formed with silicon oxide layers in between.

Figure 3E:
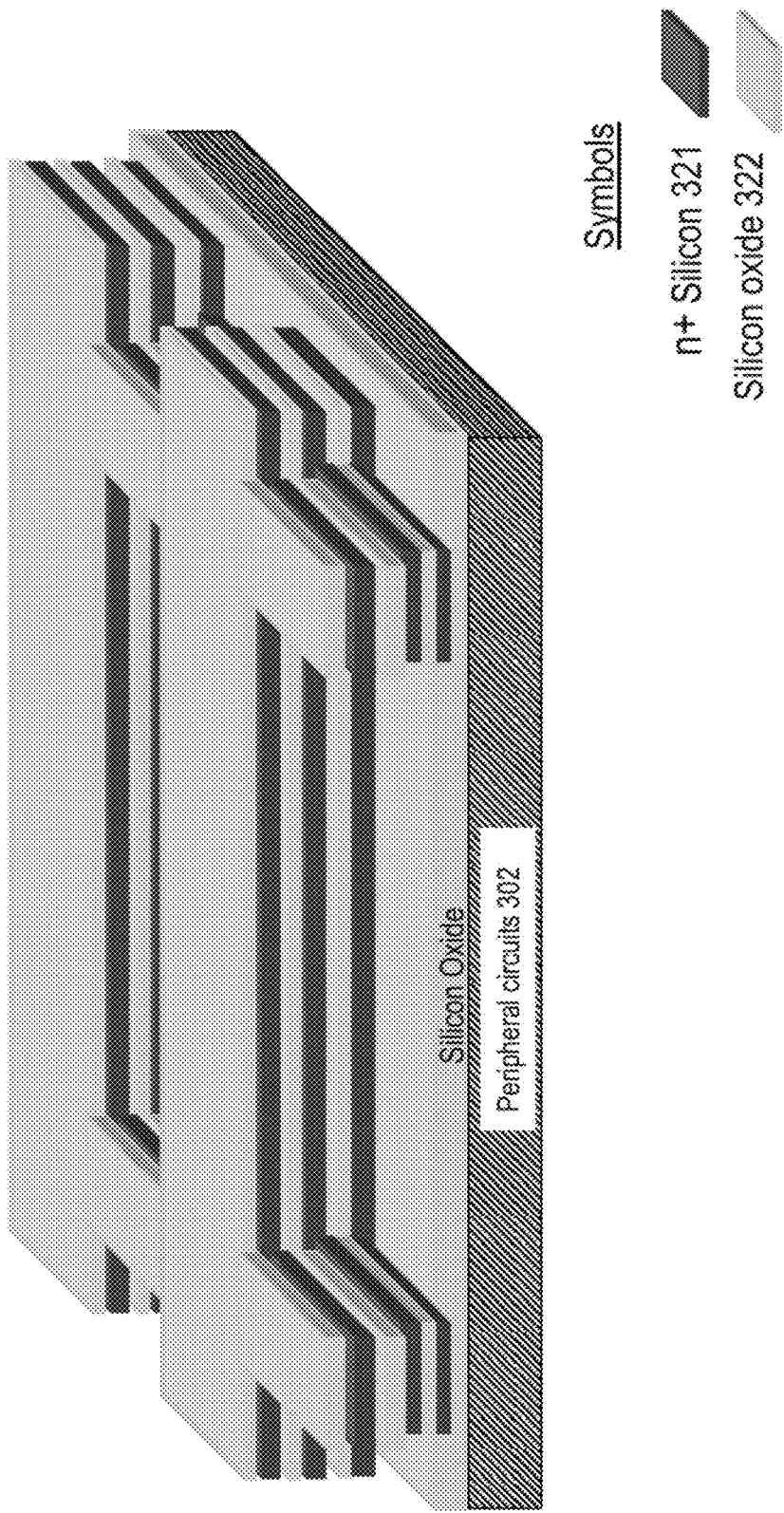

Step (E): FIG. 3E illustrates the structure after Step (E). Lithography and etch processes may then be utilized to make a structure as shown in the figure, including n+ silicon layer regions 321 and silicon oxide layer regions 322.

Figure 3F:
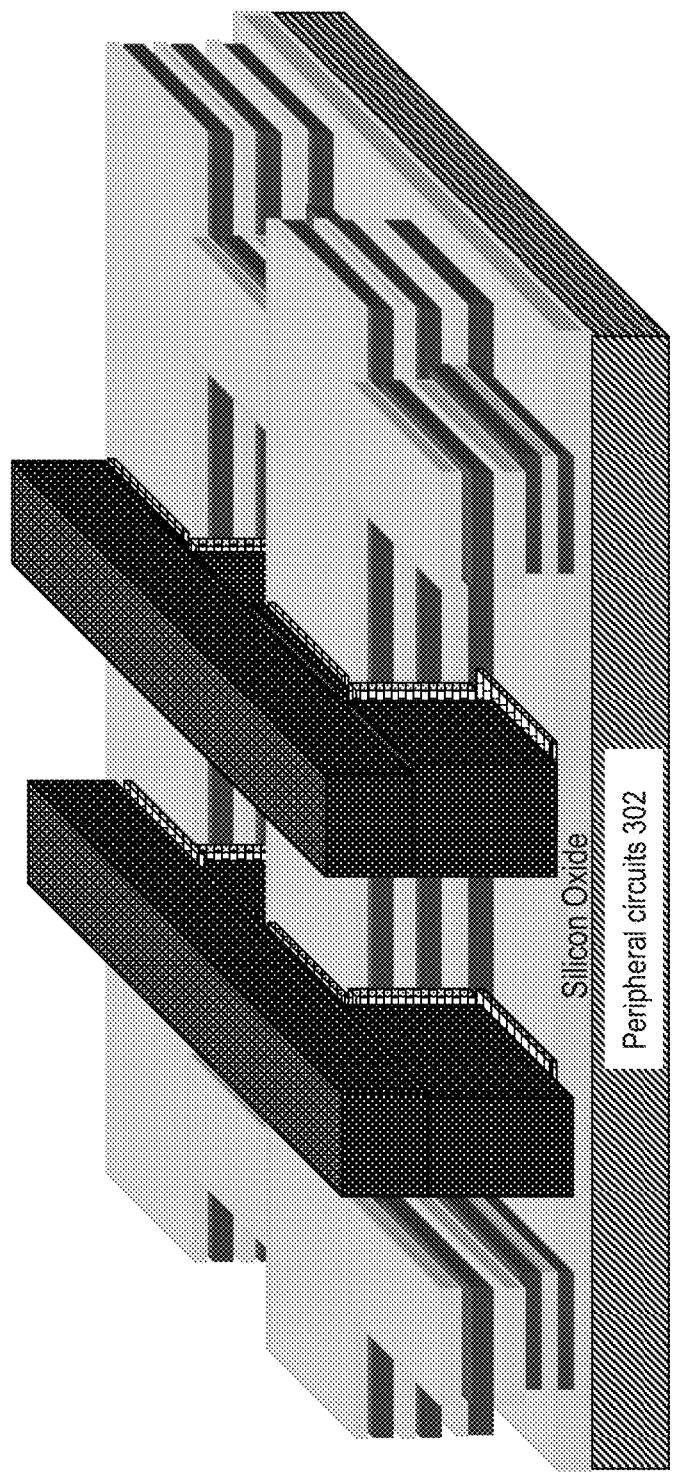

Step (F): FIG. 3F illustrates the structure after Step (F). Gate dielectric 326 and gate electrode 324 are then deposited following which a CMP may be performed to planarize the gate electrode 324 regions. Lithography and etch are utilized to define gate regions.

Figure 3G:
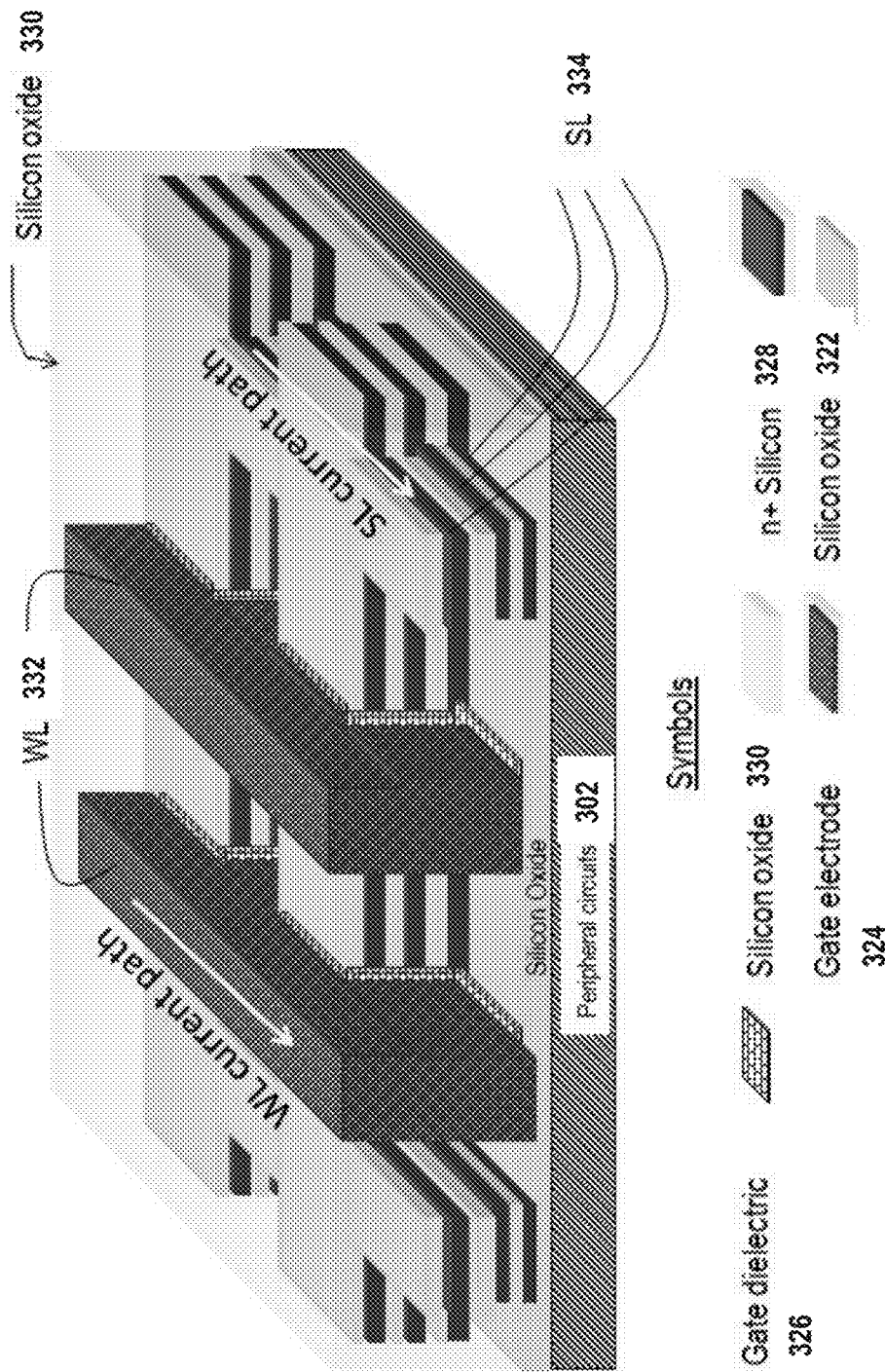

Step (G): FIG. 3G illustrates the structure after Step (G). A silicon oxide layer 330 may be then deposited and planarized. The silicon oxide layer is shown transparent in the figure for clarity, along with word-line (WL) 332 and source-line (SL) 334 regions.

Figure 3H:
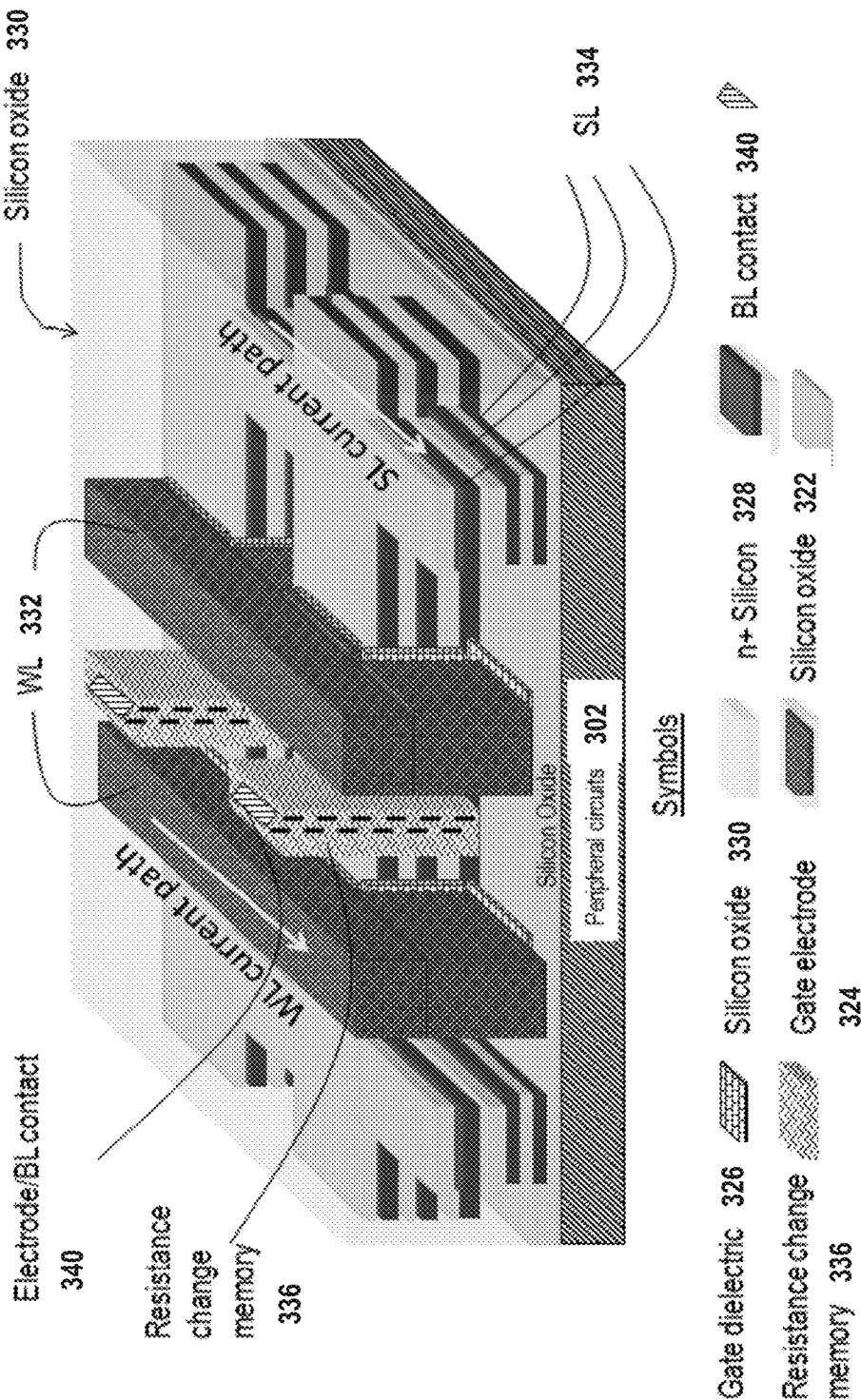

Step (H): FIG. 3H illustrates the structure after Step (H). Vias are etched through multiple layers of silicon and silicon dioxide as shown in the figure. A resistance change memory material 336 may be then deposited (preferably with atomic layer deposition (ALD)). Examples of such a material include hafnium oxide, well known to change resistance by applying voltage. An electrode for the resistance change memory element may be then deposited (preferably using ALD) and is shown as electrode/BL contact 340. A CMP process may be then conducted to planarize the surface. It can be observed that multiple resistance change memory elements in series with junction-less transistors are created after this step.

Figure 3I:
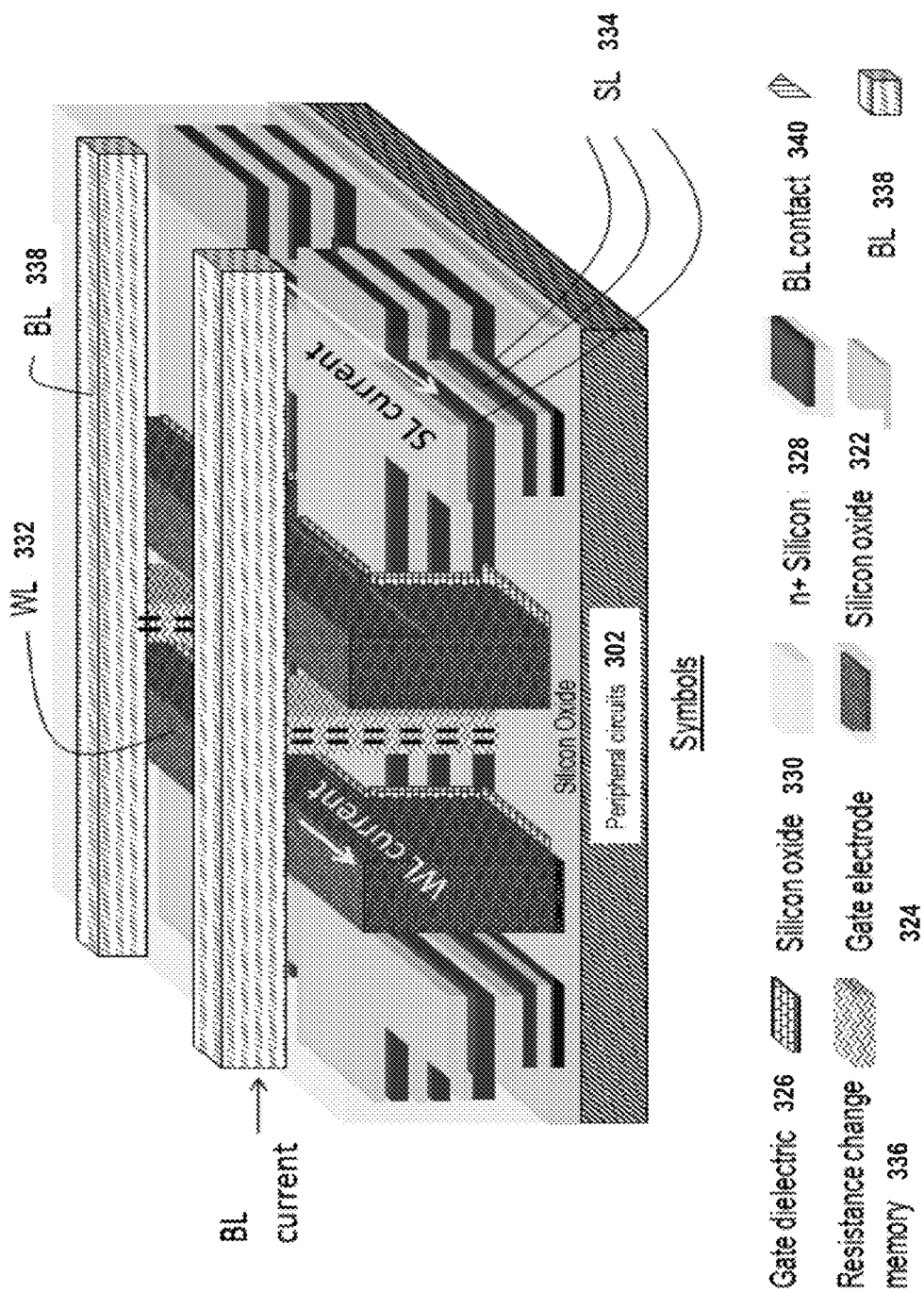
Figure 3J:
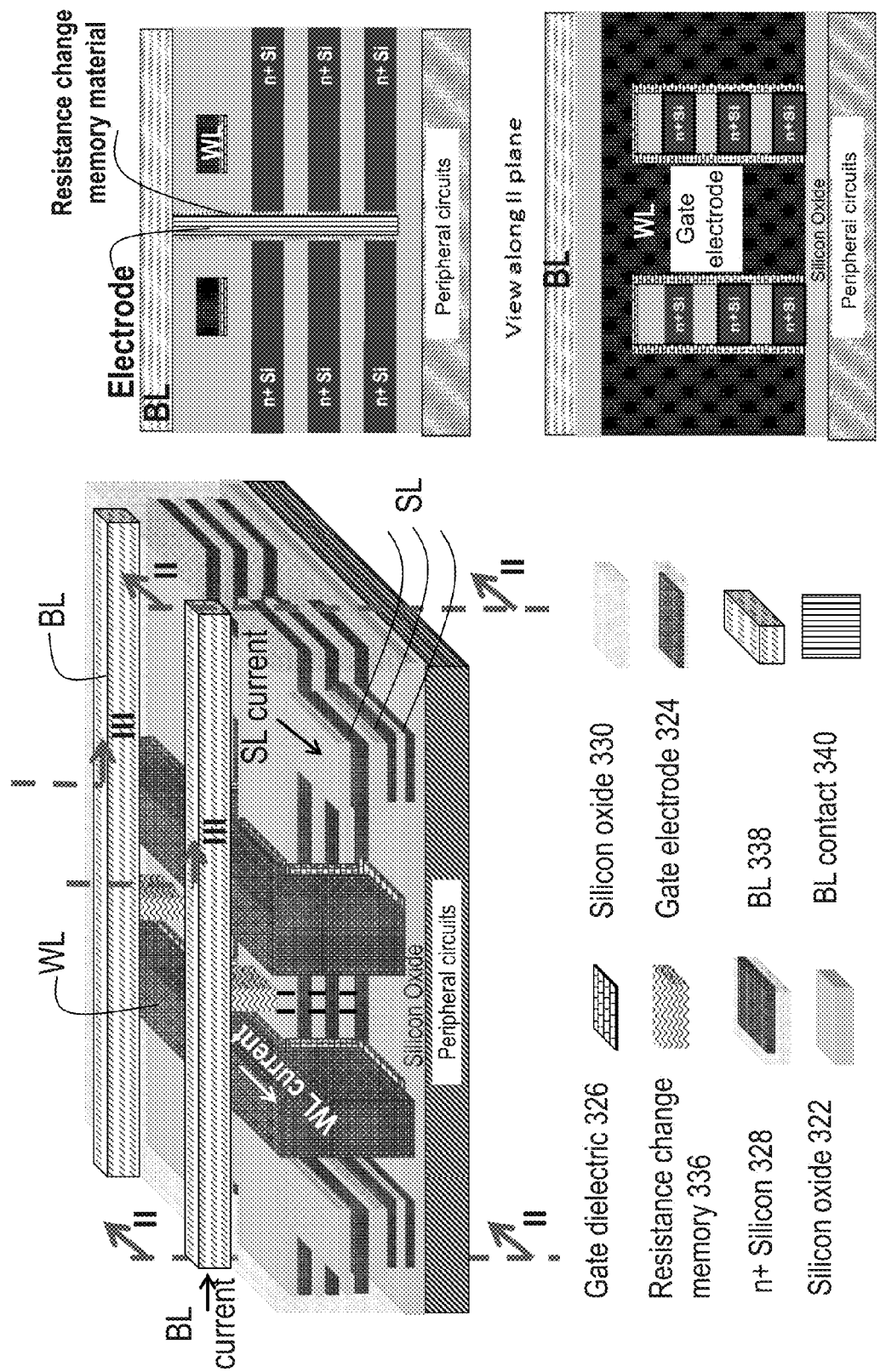

Step (I): FIG. 3I illustrates the structure after Step (I). BLs 338 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well. FIG. 3J shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) mono-crystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 3A-J. Various other types of layer transfer schemes that have been described herein can be utilized for construction of various 3D resistive memory structures. One could also use buried wiring, i.e. where wiring for memory arrays may be below the memory layers but above the periphery. Other variations of the monolithic 3D resistive memory concepts are possible.

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIGS. 4A-G are relevant for any type of charge-trap memory.

FIG. 4A-G describes a memory architecture for single-crystal 3D charge-trap memories, and a procedure for its construction. It utilizes junction-less transistors. No mask may be utilized on a "per-memory-layer" basis for the monolithic 3D charge-trap memory concept shown in FIGS. 4A-G, and all other masks are shared between different layers. The process flow may include several steps as described in the following sequence.

Figure 4A:
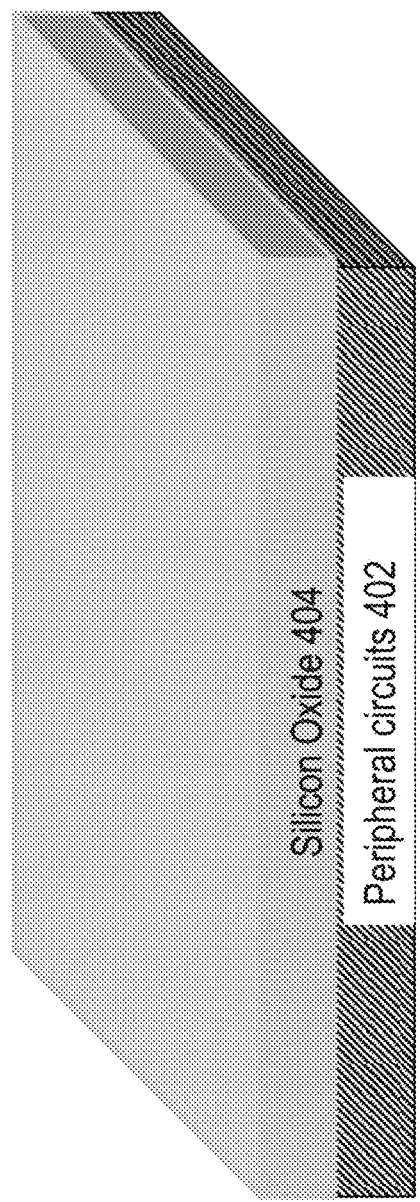
FIGS. 4A-4G show a zero-mask per layer 3D charge-trap memory.

Step (A): Peripheral circuits 402 are first constructed and above this oxide layer 404 may be deposited. FIG. 4A shows a drawing illustration after Step (A).

Figure 4B:
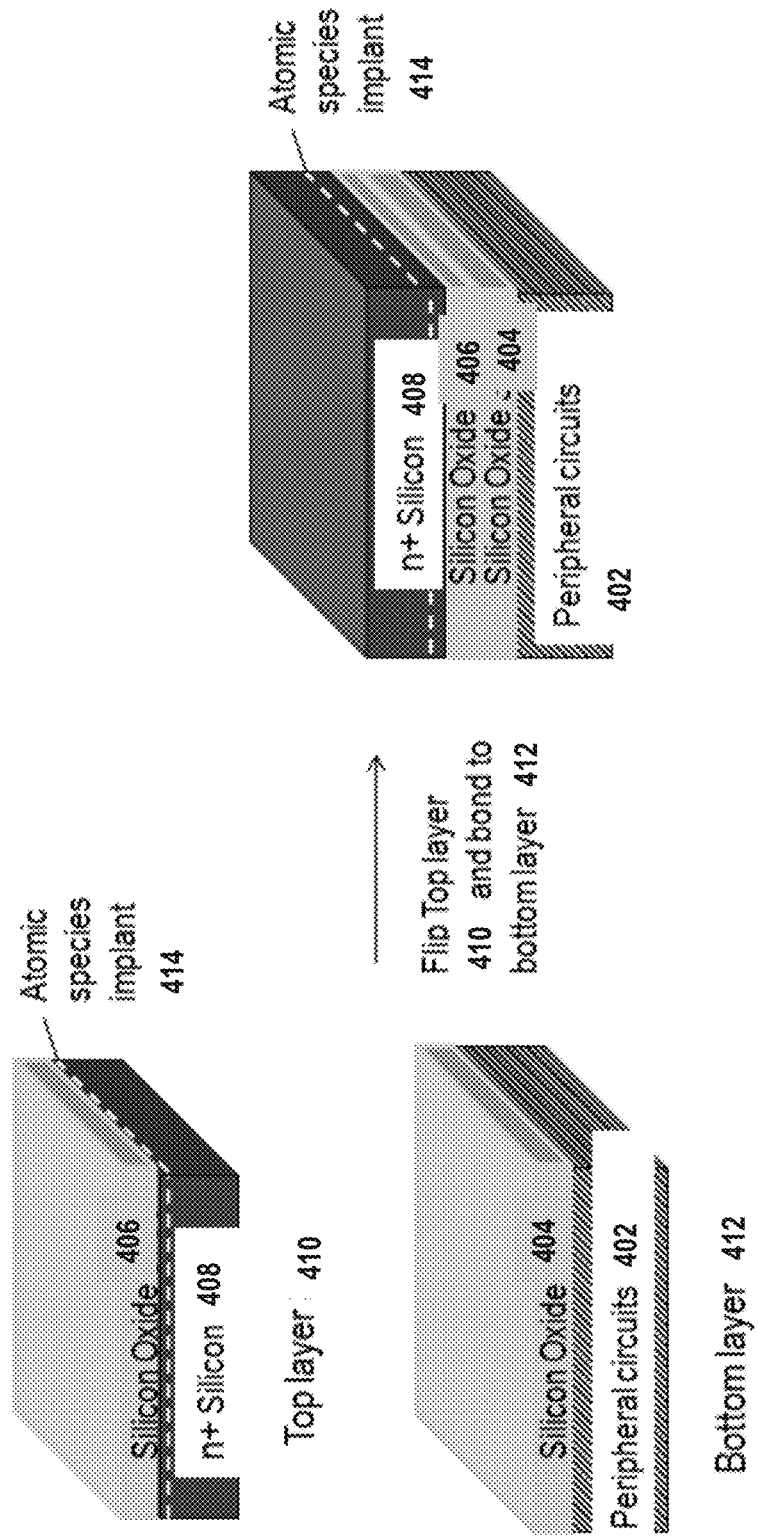

Step (B): FIG. 4B illustrates the structure after Step (B). A wafer of n+ Silicon 408 has an oxide layer 406 grown or deposited above it. A doped and activated layer may be formed in or on n+ silicon wafer 408 by processes such as, for example, implant and RTA or furnace activation, or epitaxial deposition and activation. Following this, hydrogen may be implanted into the n+ Silicon wafer at a certain depth indicated by 414. Alternatively, some other atomic species such as Helium could be implanted. This hydrogen implanted n+ Silicon wafer 408 forms the top layer 410. The bottom layer 412 may include the peripheral circuits 402 with oxide layer 404. The top layer 410 may be flipped and bonded to the bottom layer 412 using oxide-to-oxide bonding. Alternatively, n+ silicon wafer 408 may be doped differently, such as, for example, with elemental species that form a p+, or p−, or n− silicon wafer, or substantially absent of semiconductor dopants to form an undoped silicon wafer.

Figure 4C:
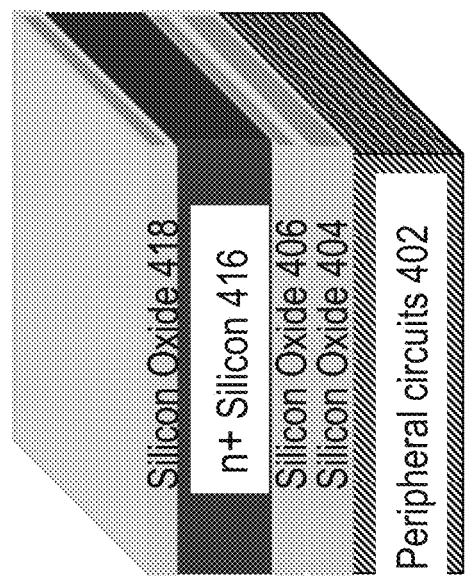

Step (C): FIG. 4C illustrates the structure after Step (C). The stack of top and bottom wafers after Step (B) may be cleaved at the hydrogen plane 414 using either a anneal or a sideways mechanical force or other means. A CMP process may be then conducted. A layer of silicon oxide 418 may be then deposited atop the n+ Silicon layer 416. At the end of this step, a single-crystal n+ Si layer 416 exists atop the peripheral circuits, and this has been achieved using layer transfer techniques.

Figure 4D:
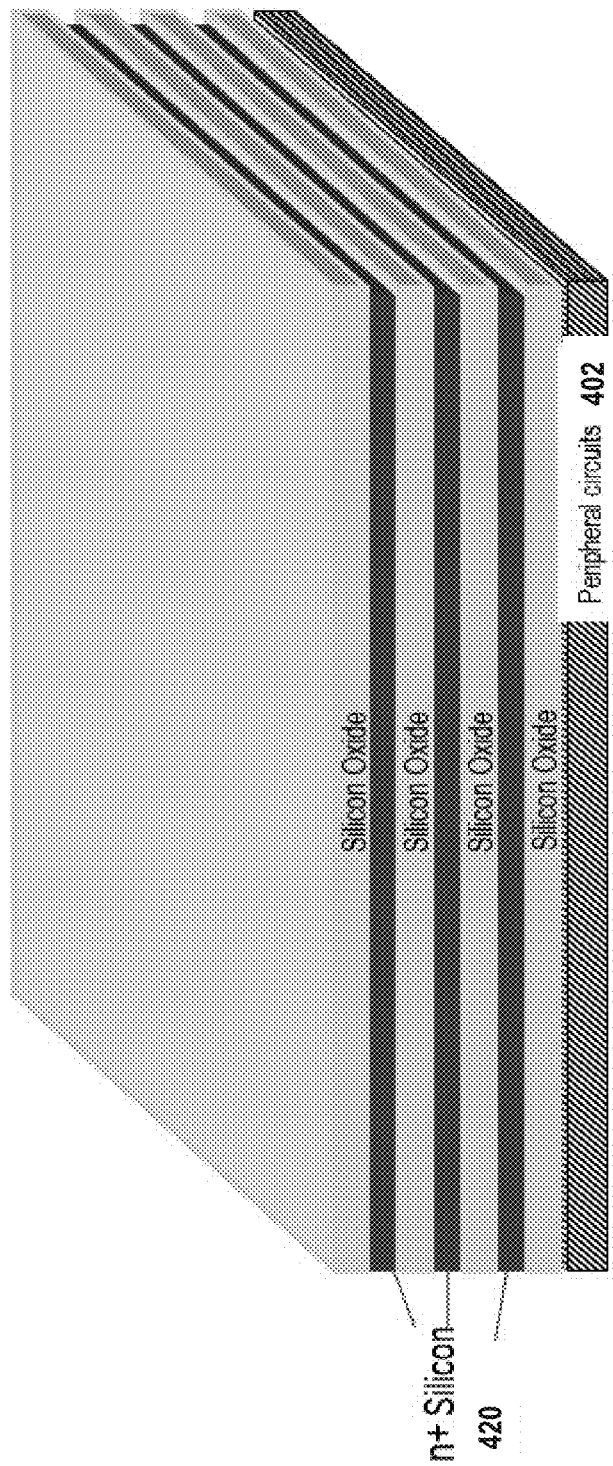

Step (D): FIG. 4D illustrates the structure after Step (D). Using methods similar to Step (B) and (C), multiple n+ silicon layers 420 are formed with silicon oxide layers in between.

Figure 4E:
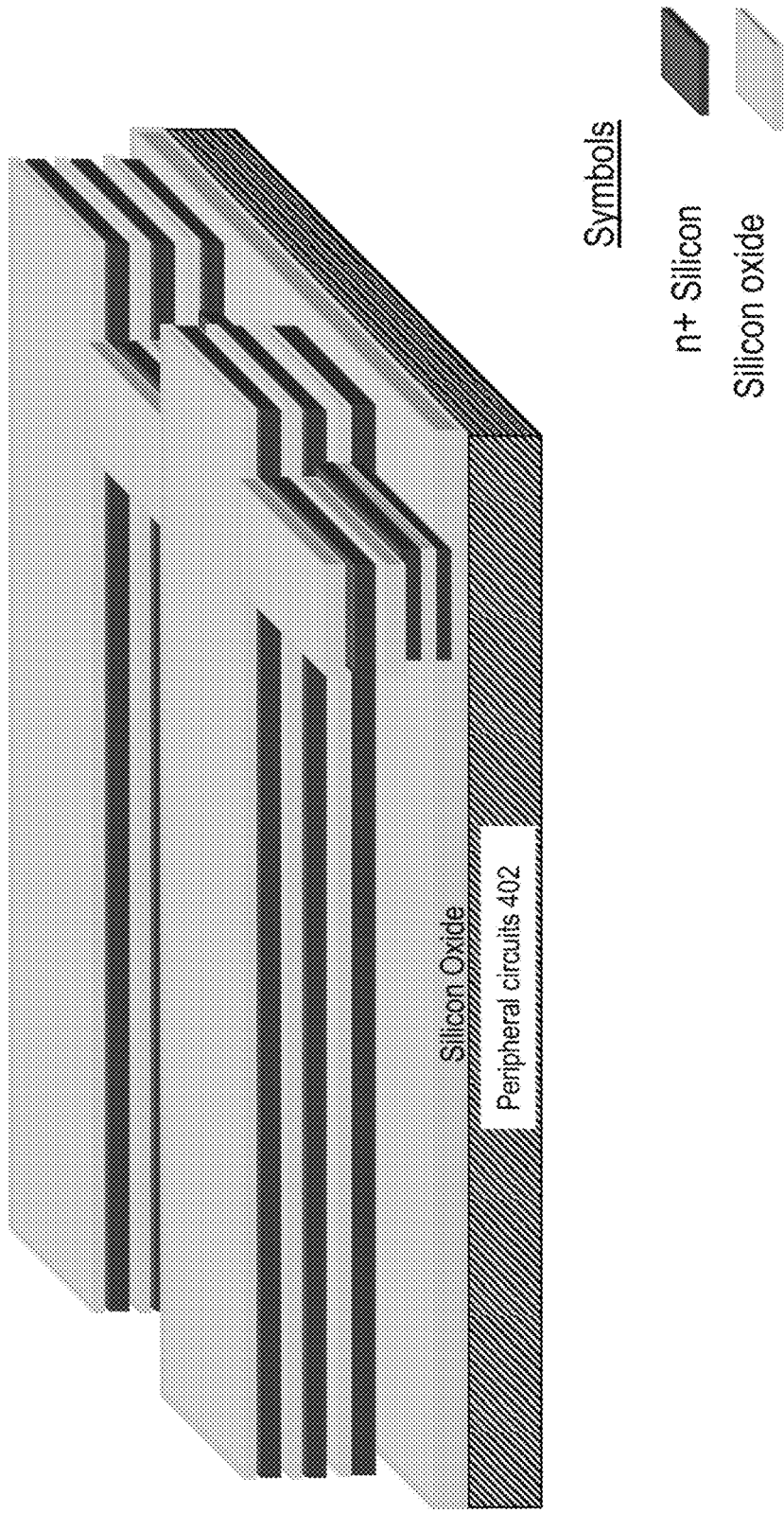

Step (E): FIG. 4E illustrates the structure after Step (E). Lithography and etch processes are then utilized to make a structure as shown in the figure.

Figure 4F:
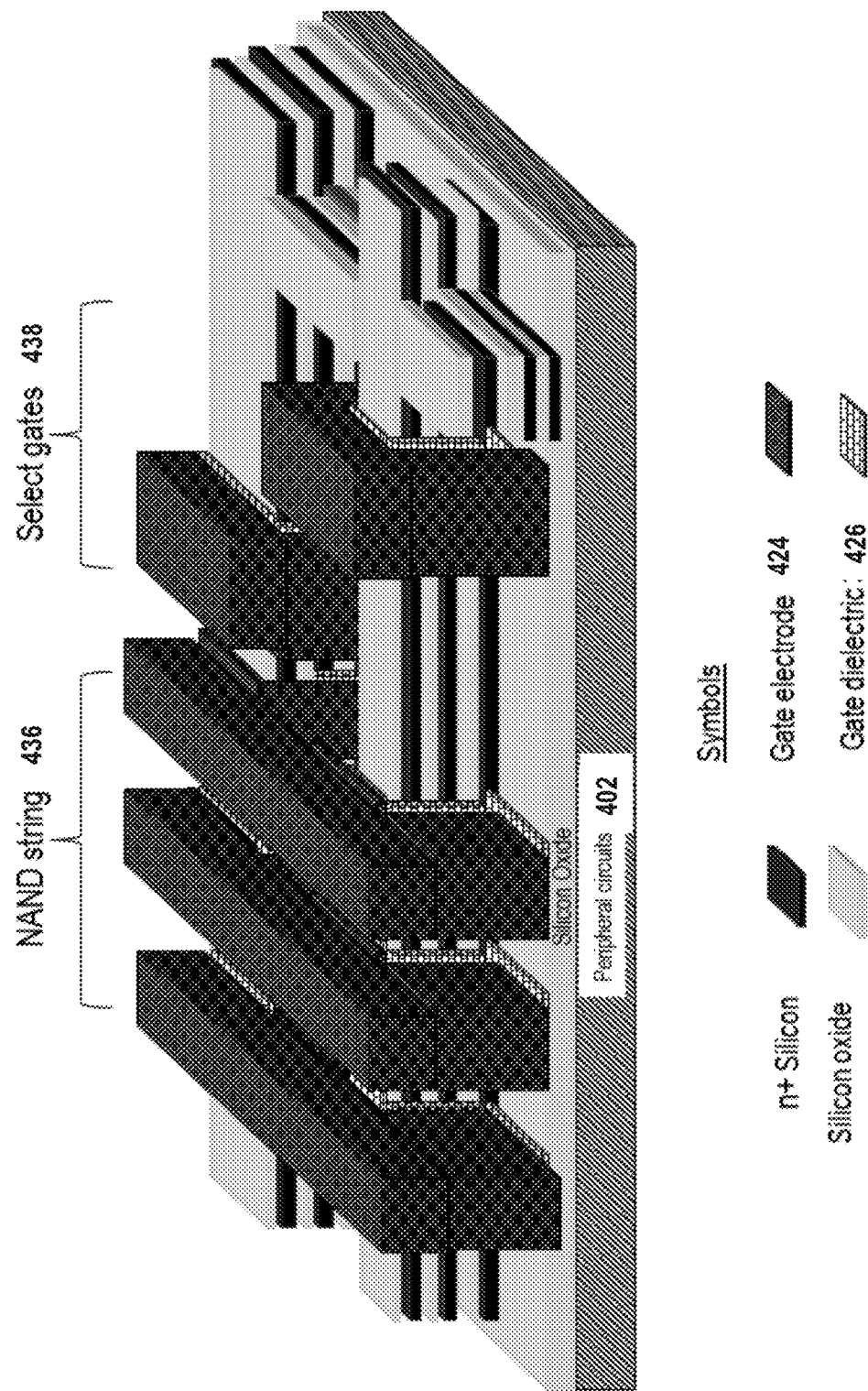

Step (F): FIG. 4F illustrates the structure after Step (F). Gate dielectric 426 and gate electrode 424 are then deposited following which a CMP may be done to planarize the gate electrode 424 regions. Lithography and etch are utilized to define gate regions. Gates of the NAND string 436 as well gates of select gates of the NAND string 438 are defined.

Figure 4G:
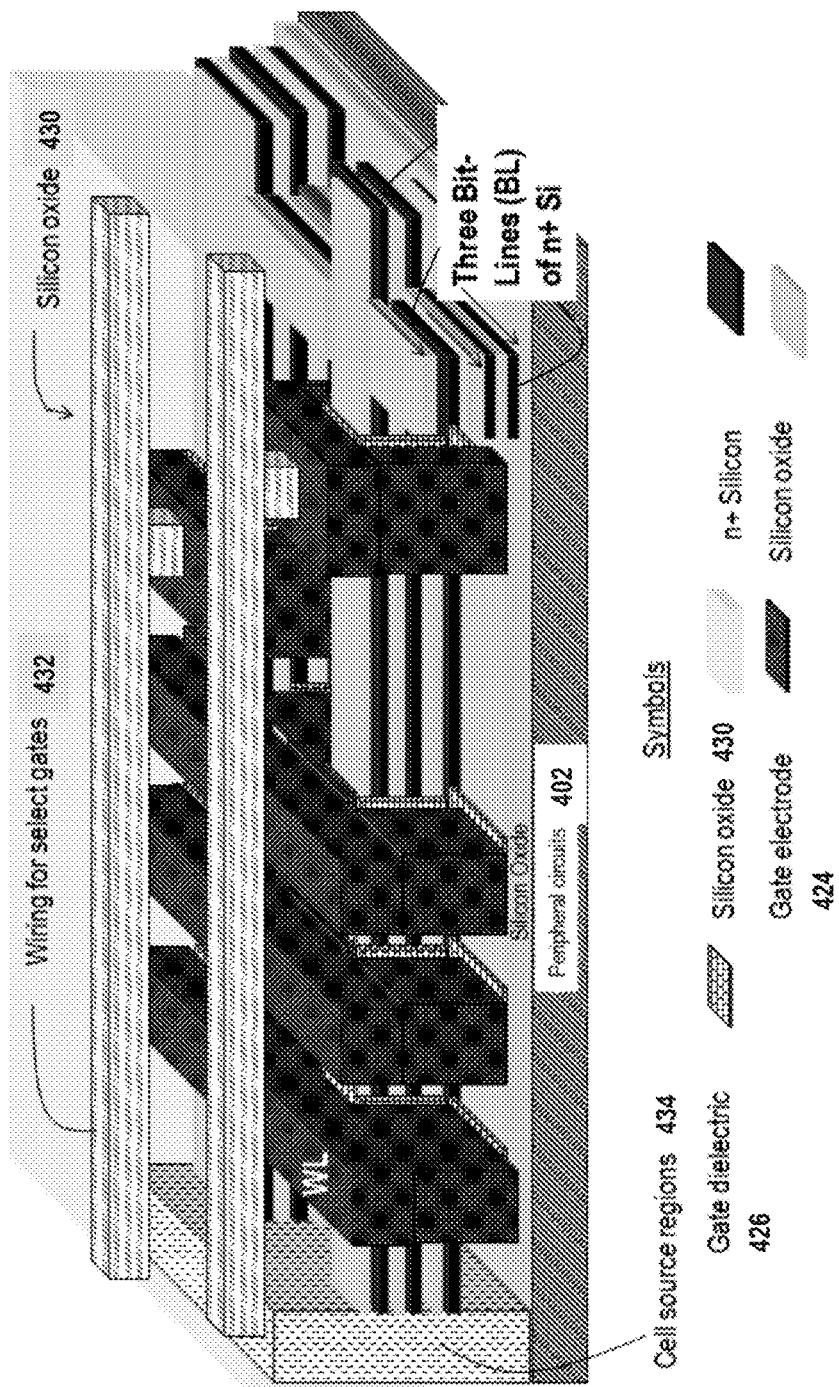

Step (G): FIG. 4G illustrates the structure after Step (G). A silicon oxide layer 430 may be then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) mono-crystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

While FIGS. 36A-F and FIG. 37A-G give two examples of how single-crystal silicon layers with ion-cut can be used to produce 3D charge-trap memories, the ion-cut technique for 3D charge-trap memory may be fairly general. It could be utilized to produce any horizontally-oriented 3D mono-crystalline silicon charge-trap memory. FIG. 38A-D further illustrates how general the process can be. One or more doped silicon layers 3802, including oxide layer 3804, can be layer transferred atop any peripheral circuit layer 3806 using procedures shown in FIG. 2. These are indicated in FIG. 38A, FIG. 38B and FIG. 38C. Following this, different procedures can be utilized to form different types of 3D charge-trap memories. For example, procedures shown in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Multi-layered Vertical Gate NAND Flash overcoming stacking limit for terabit density storage", Symposium on VLSI Technology, 2009 by W. Kim, S. Choi, et al. can be used to produce the two different types of horizontally oriented single crystal silicon 3D charge trap memory shown in FIG. 38D.

While the 3D DRAM and 3D resistive memory implementations herein have been described with single crystal silicon constructed with ion-cut technology, other options exist. One could construct them with selective epi technology. Procedures for doing these will be clear to those skilled in the art.

FIG. 5A-B may not be the only option for the architecture, as depicted in, for example, FIG. 1 through FIG. 4. Peripheral transistors within periphery layer 502 may be constructed below the memory layers, for example, memory layer 1 504, memory layer 2 506, and/or memory layer 3 508. Peripheral transistors within periphery layer 510 could also be constructed above the memory layers, for example, memory layer 1 504, memory layer 2 506, and/or memory layer 3 508, which may be atop substrate or memory layer 4 512, as shown in FIG. 5B.

The double gate devices shown in FIG. 1 through FIG. 4 have both gates connected to each other. Each gate terminal may be controlled independently, which may lead to design advantages for memory chips.

One of the concerns with using n+ Silicon as a control line for 3D memory arrays may be its high resistance. Using lithography and (single-step or multi-step) ion-implantation, one could dope heavily the n+ silicon control lines while not doping transistor gates, sources and drains in the 3D memory array. This preferential doping may mitigate the concern of high resistance.

Activating dopants in standard CMOS transistors at less than about 400° C.-450° C. may be a serious challenge. Due to this, forming 3D stacked circuits and chips may be challenging, unless techniques to activate dopants of source-drain regions at less than about 400° C.-450° C. can be obtained. For some compound semiconductors, dopants can be activated at less than about 400° C. An embodiment of this invention involves using such compound semiconductors, such as antimonides (eg. InGaSb), for constructing 3D integrated circuits and chips.

The process flow shown in FIG. 6A-F describes an embodiment of this invention, where techniques may be used that may lower activation temperature for dopants in silicon to less than about 450° C., and potentially even lower than about 400° C. The process flow could include the following steps that occur in sequence from Step (A) to Step (F). When the same reference numbers are used in different drawing figures (among FIG. 6A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 6A:
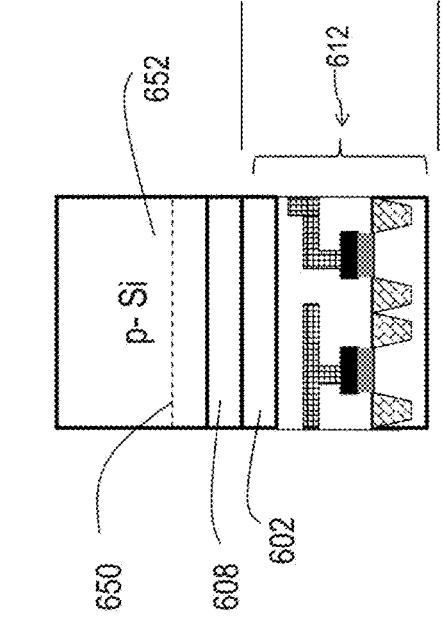

Step (A) is illustrated using FIG. 6A. A p− Silicon wafer 652 with activated dopants may have an oxide layer 608 deposited atop it. Hydrogen could be implanted into the wafer at a certain depth to form hydrogen plane 650 indicated by a dotted line. Alternatively, helium could be used.

Figure 6B:
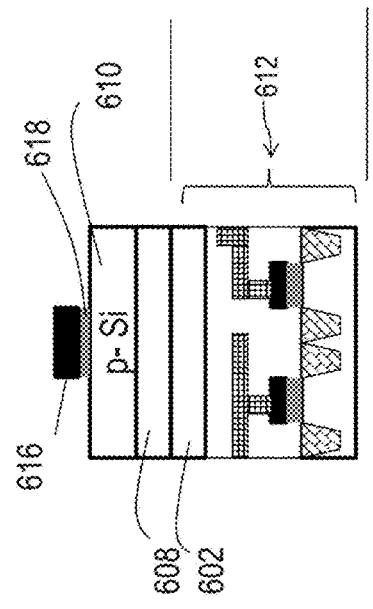

Step (B) is illustrated using FIG. 6B. A wafer with transistors and wires may have an oxide layer 602 deposited atop it to form the structure 612. The structure shown in FIG. 6A could be flipped and bonded to the structure 612 using oxide-to-oxide bonding of layers 602 and 608.

Figure 6C:
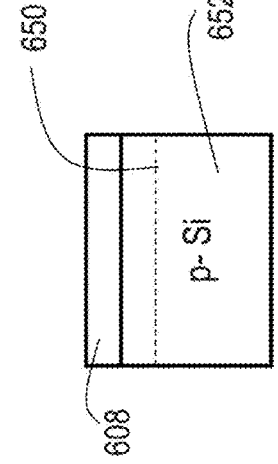

Step (C) is illustrated using FIG. 6C. The structure shown in FIG. 6B could be cleaved at its hydrogen plane 650 using a mechanical force, thus forming p− layer 610. Alternatively, an anneal could be used. Following this, a CMP could be conducted to planarize the surface.

Figure 6D:
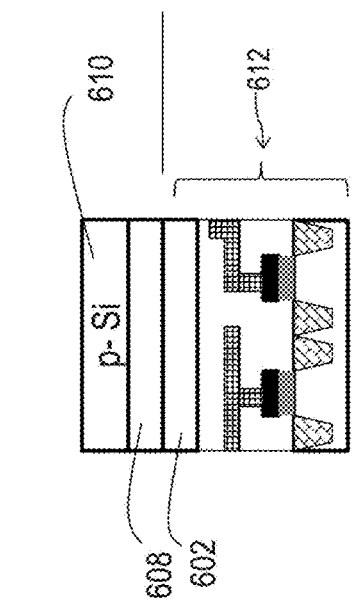

Step (D) is illustrated using FIG. 6D. Isolation regions (not shown) between transistors can be formed using a shallow trench isolation (STI) process. Following this, a gate dielectric 618 and a gate electrode 616 could be formed using deposition or growth, followed by a patterning and etch.

Step (E) is illustrated using FIG. 6E, and involves forming and activating source-drain regions. One or more of the following processes can be used for this step.

(i) A hydrogen plasma treatment can be conducted, following which dopants for source and drain regions 620 can be implanted. Following the implantation, an activation anneal can be performed using a rapid thermal anneal (RTA). Alternatively, a laser anneal could be used. Alternatively, a spike anneal could be used. Alternatively, a furnace anneal could be used. Hydrogen plasma treatment before source-drain dopant implantation is known to reduce temperatures for source-drain activation to be less than about 450° C. or even less than about 400° C. Further details of this process for forming and activating source-drain regions are described in "Mechanism of Dopant Activation Enhancement in Shallow Junctions by Hydrogen", Proceedings of the Materials Research Society, Spring 2005 by A. Vengurlekar, S. Ashok, Christine E. Kalnas, Win Ye. This embodiment of the invention advantageously uses this low-temperature source-drain formation technique and layer transfer techniques and produces 3D integrated circuits and chips.

(ii) Alternatively, another process can be used for forming activated source-drain regions. Dopants for source and drain regions 620 can be implanted, following which a hydrogen implantation can be conducted. Alternatively, some other atomic species can be used. An activation anneal can then be conducted using a RTA. Alternatively, a furnace anneal or spike anneal or laser anneal can be used. Hydrogen implantation is known to reduce temperatures required for the activation anneal. Further details of this process are described in U.S. Pat. No. 4,522,657. This embodiment of the invention advantageously uses this low-temperature source-drain formation technique and layer transfer techniques and produces 3D integrated circuits and chips. While (i) and (ii) described two techniques of using hydrogen to lower anneal temperature requirements, various other methods of incorporating hydrogen to lower anneal temperatures could be used.

(iii) Alternatively, another process can be used for forming activated source-drain regions. The wafer could be heated up when implantation for source and drain regions 620 is carried out. Due to this, the energetic implanted species is subjected to higher temperatures and can be activated at the same time as it is implanted. Further details of this process can be seen in U.S. Pat. No. 6,111,260. This embodiment of the invention advantageously uses this low-temperature source-drain formation technique and layer transfer techniques and produces 3D integrated circuits and chips.

(iv) Alternatively, another process could be used for forming activated source-drain regions. Dopant segregation techniques (DST) may be utilized to efficiently modulate the source and drain Schottky barrier height for both p and n type junctions. These DSTs may utilized form a dopant segregated Schottky (DSS-Schottky) transistor. Metal or metals, such as platinum and nickel, may be deposited, and a silicide, such as $Ni_{0.9}Pt_{0.1}Si$, may formed by thermal treatment or an optical treatment, such as a laser anneal, following which dopants for source and drain regions 620 may be implanted, such as arsenic and boron, and the dopant pile-up is initiated by a low temperature post-silicidation activation step, such as a thermal treatment or an optical treatment, such as a laser anneal. An alternate DST is as follows: Metal or metals, such as platinum and nickel, may be deposited, following which dopants for source and drain regions 620 may be implanted, such as arsenic and boron, followed by dopant segregation induced by the silicidation thermal budget wherein a silicide, such as $Ni_{0.9}Pt_{0.1}Si$, may formed by thermal treatment or an optical treatment, such as a laser anneal. Alternatively, dopants for source and drain regions 620 may be implanted, such as arsenic and boron, following which metal or metals, such as platinum and nickel, may be deposited, and a silicide, such as $Ni_{0.9}Pt_{0.1}Si$, may formed by thermal treatment or an optical treatment, such as a laser anneal. Further details of these processes for forming dopant segregated source-drain regions are described in "Low Temperature Implementation of Dopant-Segregated Band-edger Metallic S/D junctions in Thin-Body SOI p-MOSFETs", Proceedings IEDM, 2007, pp 147-150, by G. Larrieu, et al.; "A Comparative Study of Two Different Schemes to Dopant Segregation at NiSi/Si and PtSi/Si Interfaces for Schottky Barrier Height Lowering", IEEE Transactions on Electron Devices, vol. 55, no. 1, January 2008, pp. 396-403, by Z. Qiu, et al.; and "High-k/Metal-Gate Fully Depleted SOI CMOS With Single-Silicide Schottky Source/Drain With Sub-30-nm Gate Length", IEEE Electron Device Letters, vol. 31, no. 4, April 2010, pp. 275-277, by M. H. Khater, et al.

This embodiment of the invention advantageously uses this low-temperature source-drain formation technique and layer transfer techniques and produces 3D integrated circuits and chips.

Step (F) is illustrated using FIG. 6F. An oxide layer 622 may be deposited and polished with CMP. Following this, contacts, multiple levels of metal and other structures can be formed to obtain a 3D integrated circuit or chip. If desired, the original materials for the gate electrode 616 and gate dielectric 618 can be removed and replaced with a deposited gate dielectric and deposited gate electrode using a replacement gate process similar to the one described previously.

Persons of ordinary skill in the art will appreciate that the low temperature source-drain formation techniques described in FIG. 6, such as dopant segregation and DSS-Schottky transistors, may also be utilized to form other 3D structures in this document and in incorporated reference U.S. Pat. No. 8,642,416, including, but not limited to, floating body DRAM, such as described in FIGS. 29,30,31, 71, and junction-less transistors, such as described in FIGS. 5,6,7,8,9,60, and RCATs, such as described in FIGS. 10, 12, 13, and CMOS MOSFETS, such as described in FIGS. 25, 47, 49, and resistive memory, such as described in FIGS. 32, 33, 34, 35, and charge trap memory, such as described in FIGS. 36, 37, 38, and floating gate memory, such as described in FIGS. 39, 40, 70, and SRAM, such as described in FIG. 52, and Finfets, such as described in FIG. 61. Thus the invention is to be limited only by the appended claims.

While concepts in this patent application have been described with respect to 3D-ICs with two stacked device layers, those of ordinary skill in the art will appreciate that it can be valid for 3D-ICs with more than two stacked device layers.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems such as mobile phones, smart phone, cameras and the like. For example, incorporating the 3D IC semiconductor devices according to some embodiments of the invention within these mobile electronic devices and mobile systems could provide superior mobile units that could operate much more efficiently and for a much longer time than with prior art technology. The 3D IC techniques and the methods to build devices according to various embodiments of the invention could empower the mobile smart system to win in the market place, as they provide unique advantages for aspects that are very important for 'smart' mobile devices, such as, low size and volume, low power, versatile technologies and feature integration, low cost, self-repair, high memory density, high performance. These advantages would not be achieved without the use of some embodiment of the invention.

3D ICs according to some embodiments of the invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the invention could far exceed what was practical with the prior art technology. These advantages could lead to more powerful computer systems and improved systems that have embedded computers.

Some embodiments of the invention may also enable the design of state of the art electronic systems at a greatly reduced non-recurring engineering (NRE) cost by the use of high density 3D FPGAs or various forms of 3D array base ICs with reduced custom masks as been described previously.

These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

It will also be appreciated by persons of ordinary skill in the art that the invention is not limited to what has been particularly shown and described hereinabove. Rather, the scope of the invention includes both combinations and sub-combinations of the various features described hereinabove as well as modifications and variations which would occur to such skilled persons upon reading the foregoing description. Thus the invention is to be limited only by the appended claims.

What is claimed is:

1. A 3D integrated circuit device, comprising:
a first transistor;
a second transistor; and
a third transistor,
   wherein said third transistor is overlaying said second transistor and said third transistor is controlled by a third control line,
   wherein said second transistor is overlaying said first transistor and said second transistor is controlled by a second control line,
   wherein said first transistor is part of a control circuit controlling said second control line and said third control line,
   wherein said second transistor and said third transistor are self-aligned.

2. The device according to claim 1,
wherein said second transistor is aligned to said first transistor with less than 100 nm and greater than 5 nm misalignment.

3. The device according to claim 1, further comprising:
a third memory cell comprising said third transistor;
a second memory cell comprising said second transistor; and
memory periphery circuits comprising said first transistor,
   wherein said memory periphery circuits control at least said third memory cell and second memory cell.

4. The device according to claim 1,
wherein said second transistor is connected to said third transistor with an ohmic connection.

5. The device according to claim 1,
wherein said second transistor is a junction-less transistor.

6. The device according to claim 1,
wherein said second transistor comprises a schottky barrier.

7. The device according to claim 1,
wherein said second transistor comprises a second source and a second drain,
wherein said third transistor comprises a third source and a third drain,
wherein said second source is connected to said third source and said second drain is connected to said third drain, each with an ohmic connection.

8. A 3D integrated circuit device, comprising:
a first transistor;
a second transistor; and
a third transistor,
   wherein said third transistor is overlaying said second transistor and said third transistor is controlled by a third control line,
   wherein said second transistor is overlaying said first transistor and said second transistor is controlled by a second control line,
   wherein said second transistor comprises a schottky barrier, and
   wherein said second transistor and said third transistor are self-aligned.

9. The device according to claim 8,
wherein said second transistor is aligned to said first transistor with less than 100 nm and greater than 5 nm misalignment.

10. The device according to claim 8, further comprising:
a third memory cell comprising said third transistor;
a second memory cell comprising said second transistor; and
memory periphery circuits comprising said first transistor,
   wherein said memory periphery circuits control at least said third memory cell and second memory cell.

11. The device according to claim 8,
wherein said second transistor is connected to said third transistor with an ohmic connection.

12. The device according to claim 8,
wherein said second transistor is a junction-less transistor.

13. The device according to claim 8,
wherein said first transistor is part of a control circuit controlling said second control line and said third control line.

14. The device according to claim 8,
wherein said second transistor comprises a second source and a second drain,
wherein said third transistor comprises a third source and a third drain,
wherein said second source is connected to said third source and said second drain is connected to said third drain, each with an ohmic connection.

15. A 3D integrated circuit device, comprising:
a first transistor;
a first memory cell comprising a second transistor; and
a second memory cell comprising a third transistor,
   wherein said third transistor is overlaying said second transistor and said second transistor is overlaying said first transistor,
   wherein said first transistor is part of a control circuit controlling said first memory cell and second memory cell,
   wherein said second transistor is self-aligned to said third transistor, and
   wherein said second transistor is connected to said third transistor with an ohmic connection.

16. The device according to claim 15,
wherein said first transistor, said second transistor and said third transistor are aligned to each other with less than 100 nm and greater than 5 nm misalignment.

17. The device according to claim 15, further comprising:
memory periphery circuits comprising said first transistor,
   wherein said memory periphery circuits control at least said first memory cell and second memory cell.

18. The device according to claim 15,
wherein said second transistor is a junction-less transistor.

19. The device according to claim 15,
wherein said second transistor comprises a schottky barrier.

20. The device according to claim 15,
wherein said second transistor comprises a second source and a second drain,
wherein said third transistor comprises a third source and a third drain,
wherein said second source is connected to said third source and said second drain is connected to said third drain, each with an ohmic connection.

* * * * *